US009065559B2

(12) United States Patent
Vogas et al.

(10) Patent No.: US 9,065,559 B2
(45) Date of Patent: Jun. 23, 2015

(54) SYSTEM FOR TESTING AND CALIBRATING CORE ENGINE RADIO FREQUENCY (RF) CIRCUIT CARD ASSEMBLIES

(75) Inventors: Michael S. Vogas, Morristown, NJ (US); George Isabella, Paramus, NJ (US); Stephen J. Drexinger, Bridgewater, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 205 days.

(21) Appl. No.: 13/464,879

(22) Filed: May 4, 2012

(65) Prior Publication Data
US 2012/0289167 A1    Nov. 15, 2012

Related U.S. Application Data

(60) Provisional application No. 61/484,024, filed on May 9, 2011.

(51) Int. Cl.
H04W 24/06    (2009.01)
H04B 17/00    (2015.01)
G01R 31/28    (2006.01)

(52) U.S. Cl.
CPC ........ H04B 17/0085 (2013.01); G01R 31/2822 (2013.01)

(58) Field of Classification Search
CPC .. H04B 17/001; H04B 17/0085; H04W 24/06
See application file for complete search history.

(56) References Cited

U.S. PATENT DOCUMENTS

| | | | |
|---|---|---|---|
| 5,201,063 A | 4/1993 | Tam et al. | |
| 5,262,957 A | 11/1993 | Hearn | |
| 7,242,910 B2 | 7/2007 | Peterson, III et al. | |
| 8,437,793 B2* | 5/2013 | Donovan et al. | 455/522 |
| 8,620,620 B1* | 12/2013 | Yuen et al. | 702/183 |
| 2002/0098864 A1* | 7/2002 | Mukai et al. | 455/552 |
| 2003/0200483 A1* | 10/2003 | Sutton | 714/25 |
| 2004/0148580 A1* | 7/2004 | de Obaldia et al. | 716/4 |
| 2004/0203472 A1* | 10/2004 | Chien | 455/68 |
| 2004/0224654 A1* | 11/2004 | Javor et al. | 455/146 |
| 2005/0138490 A1* | 6/2005 | Grimes et al. | 714/56 |
| 2007/0210972 A1* | 9/2007 | Robin et al. | 343/705 |
| 2007/0232236 A1* | 10/2007 | Kasha et al. | 455/67.14 |
| 2010/0117669 A1* | 5/2010 | Clarke et al. | 324/757 |
| 2011/0216858 A1 | 9/2011 | Zeng | |
| 2011/0301905 A1* | 12/2011 | Gregg et al. | 702/106 |

* cited by examiner

*Primary Examiner* — Andrew Wendell
*Assistant Examiner* — Cindy Trandai
(74) *Attorney, Agent, or Firm* — Leo Zucker; Daniel J. Long

(57) ABSTRACT

A system for testing and calibrating communications equipment or modules. A processor is configured to perform a test or calibration procedure on a communications unit under test (UUT) in response to commands entered by an operator. Test and measurement instruments arranged to be responsive to the computer include a power supply for activating selected portions of signal paths in the UUT, one or more signal generators, and one or more instruments for measuring output signals produced by the UUT in response to the test signals. The UUT has switches and terminals for inputting test signals from and returning output signals to the instruments, and an adapter is connected between the processor and the UUT. When performing a calibration procedure, the adapter operates the switches and connects the terminals on the UUT to the test and measurement instruments under the control of the processor.

12 Claims, 34 Drawing Sheets

| | | | | |
|---|---|---|---|---|
| 477 | 75 | 06) PA_BIAS | PA_BIAS (VOLTS IN BINARY) TxPOWER= +14 TO -15 dBW | 117 | 0x00000075 |
| 478 | 75 | 06) PA_BIAS | PA_BIAS (VOLTS IN BINARY) TxPOWER=-15.1 TO -35 dBW | 117 | 0x00000075 |
| 479 | 75 | 06) PA_BIAS | PA_BIAS (VOLTS IN BINARY) TxPOWER=-35.1 TO -60 dBW | 117 | 0x00000075 |
| 480 | 75 | 06) PA_BIAS | PA_BIAS (VOLTS IN BINARY) TxPOWER=-60.1 TO -80 dBW | 117 | 0x00000075 |
| 481 | 00 | 06) PA_BIAS (RES) | RESERVED | 0 | 0x00000000 |
| 482 | 00 | 06) PA_BIAS (RES) | RESERVED | 0 | 0x00000000 |
| 483 | 0A | 07) RF_LEVEL_01 | RF_LEVEL VS POWER (VOLTS IN BINARY), 225 TO 890 MHz: POWER = -60 dBW | 10 | 0x0000000A |
| 484 | 0B | 07) RF_LEVEL_01 | RF_LEVEL VS POWER (VOLTS IN BINARY), 225 TO 890 MHz: POWER = -59.5 dBW | 11 | 0x0000000B |
| 485 | 0C | 07) RF_LEVEL_01 | RF_LEVEL VS POWER (VOLTS IN BINARY), 225 TO 890 MHz: POWER = -59 dBW | 12 | 0x0000000C |
| 486 | 0D | 07) RF_LEVEL_01 | RF_LEVEL VS POWER (VOLTS IN BINARY), 225 TO 890 MHz: POWER = -58.5 dBW | 13 | 0x0000000D |
| 487 | 0D | 07) RF_LEVEL_01 | RF_LEVEL VS POWER (VOLTS IN BINARY), 225 TO 890 MHz: POWER = -58 dBW | 13 | 0x0000000D |
| 488 | 0E | 07) RF_LEVEL_01 | RF_LEVEL VS POWER (VOLTS IN BINARY), 225 TO 890 MHz: POWER = -57.5 dBW | 14 | 0x0000000E |
| 489 | 0F | 07) RF_LEVEL_01 | RF_LEVEL VS POWER (VOLTS IN BINARY), 225 TO 890 MHz: POWER = -57 dBW | 15 | 0x0000000F |
| 490 | 10 | 07) RF_LEVEL_01 | RF_LEVEL VS POWER (VOLTS IN BINARY), 225 TO 890 MHz: POWER = -56.5 dBW | 16 | 0x00000010 |
| 491 | 11 | 07) RF_LEVEL_01 | RF_LEVEL VS POWER (VOLTS IN BINARY), 225 TO 890 MHz: POWER = -56 dBW | 17 | 0x00000011 |
| 492 | 12 | 07) RF_LEVEL_01 | RF_LEVEL VS POWER (VOLTS IN BINARY), 225 TO 890 MHz: POWER = -55.5 dBW | 18 | 0x00000012 |
| 493 | 13 | 07) RF_LEVEL_01 | RF_LEVEL VS POWER (VOLTS IN BINARY), 225 TO 890 MHz: POWER = -55 dBW | 19 | 0x00000013 |
| 494 | 14 | 07) RF_LEVEL_01 | RF_LEVEL VS POWER (VOLTS IN BINARY), 225 TO 890 MHz: POWER = -54.5 dBW | 20 | 0x00000014 |

SYSTEM FOR TESTING AND CALIBRATING CORE ENGINE RADIO FREQUENCY (RF) CIRCUIT CARD ASSEMBLIES

CROSS REFERENCE TO RELATED APPLICATION

This application claims priority under 35 U.S.C. Sec. 119 (e) of U.S. Provisional Patent Application No. 61/484,024 filed May 9, 2011, titled "Automated Calibration of the Core Engine RF CCA" and incorporated by reference in its entirety.

BACKGROUND OF THE INVENTION

1. Field of the Invention

The present invention relates to testing and calibration of radio equipment and modules.

2. Discussion of the Known Art

Manual, open loop methods of calibrating electrical circuits in radio frequency (RF) receivers, transmitters, modules, and other communications equipment are generally known. Such procedures include, e.g., setting tuned filter voltages or amplifier bias voltages by hand at different frequencies and temperatures.

Typically, an operator needs to measure and record a number of different parameters, determine whether or not the results obtained are within a desired range, and make incremental adjustments manually if needed in order to converge on a solution. Depending on the number of independent variables to be adjusted, it could take multiple iterations before the operator obtains the desired results. Repeating this procedure for many different frequencies, power levels and temperatures can therefore be very time consuming and costly.

U.S. Pat. No. 5,201,063 (Apr. 6, 1993), which is incorporated by reference, discloses an automated procedure for calibrating a radiotelephone. Computer controlled test equipment are connected to the device under test, and an output of the device is measured in response to inputs from the equipment. If an output for a given parameter under test is not within predetermined levels, an adjustment signal is produced and the output is monitored again. Further adjustments are made until the result is within a set limit, according to the patent. See also, U.S. Pat. No. 5,262,957 (Nov. 16, 1993) and No. 7,242,910 (Jul. 10, 2007), and U.S. Pat. Appl'n Pub. No. 2011/0216858 (Sep. 8, 2011), all of which are incorporated by reference.

Notwithstanding the known art, there is a need for a procedure that allows a number of different operating parameters of a communications unit under test to be measured and set within desired limits automatically, quickly, and with improved repeatability compared to the known calibration techniques. There is also a need for a procedure by which the parameters can be easily checked and adjusted periodically, in order to correct for drift over time.

SUMMARY OF INVENTION

According to the invention, a system for testing and calibrating communications equipment or modules, includes a processor configured to perform a test or calibration procedure in response to commands entered by an operator. Test and measurement instruments operatively connected to the processor include one or more power supplies for activating portions of certain signal paths in a given unit under test (UUT), one or more signal generators, and one or more instruments for measuring output signals produced by the UUT in response to test signals from the signal generators. The UUT has switches and terminals for inputting test signals from and returning output signals to the test and measurement instruments.

An interface board or adapter is connected between the UUT and the processor. When performing a test or calibration procedure, the adapter selectively operates the switches and connects the terminals of the UUT to the test and measurement instruments under the control of the processor.

For a better understanding of the invention, reference is made to the following description taken in conjunction with the accompanying drawing and the appended claims.

BRIEF DESCRIPTION OF THE DRAWING

In the drawing:

FIG. 5 is a portion of a write operation by which measured and calibrated vales for the UUT are entered into a memory;

DETAILED DESCRIPTION OF THE INVENTION

Figure 1:
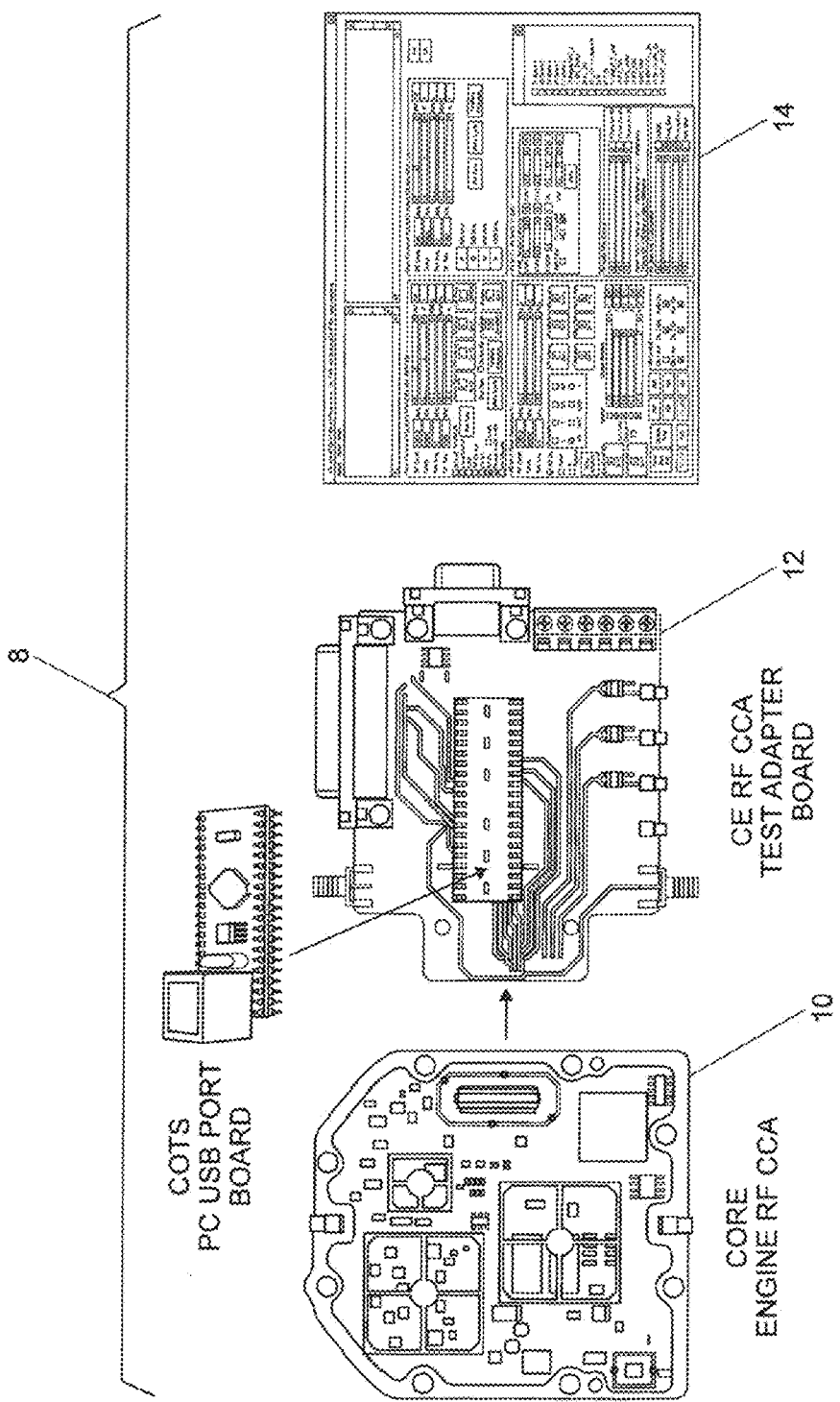
FIG. 1 is a pictorial representation of an equipment test and calibration procedure according to the invention.

FIG. 1 is a pictorial representation of the inventive test and calibration procedure. In the illustrated embodiment, various circuits and components of a communications module in the form of a core engine (CE) radio frequency (RF) circuit card assembly (CCA) 10 are tested and calibrated, wherein the CCA is constructed to operate as a radio transceiver when connected to external power, antennas, control logic, and other hardware of a communications platform. It will be understood, however, that the invention may be practiced on other kinds of communications equipment and modules that may need to be tested and calibrated at certain time intervals.

The CCA 10 is tested and calibrated at a station 8, preferably in such a manner that any variabilities in hardware used on the CCA 10 are absorbed in tuning curves that are generated during the procedure. The station 8 includes an adapter or interface board 12 that is connected to the CCA 10. The board 12 is configured to be under the control of a processor or computer 16 (see FIG. 2) running a test program 14 having a graphical user interface (GUI). The test program may be written for a standard operating system supported by the computer 16 such as, e.g., Windows XP®.

Figure 2:
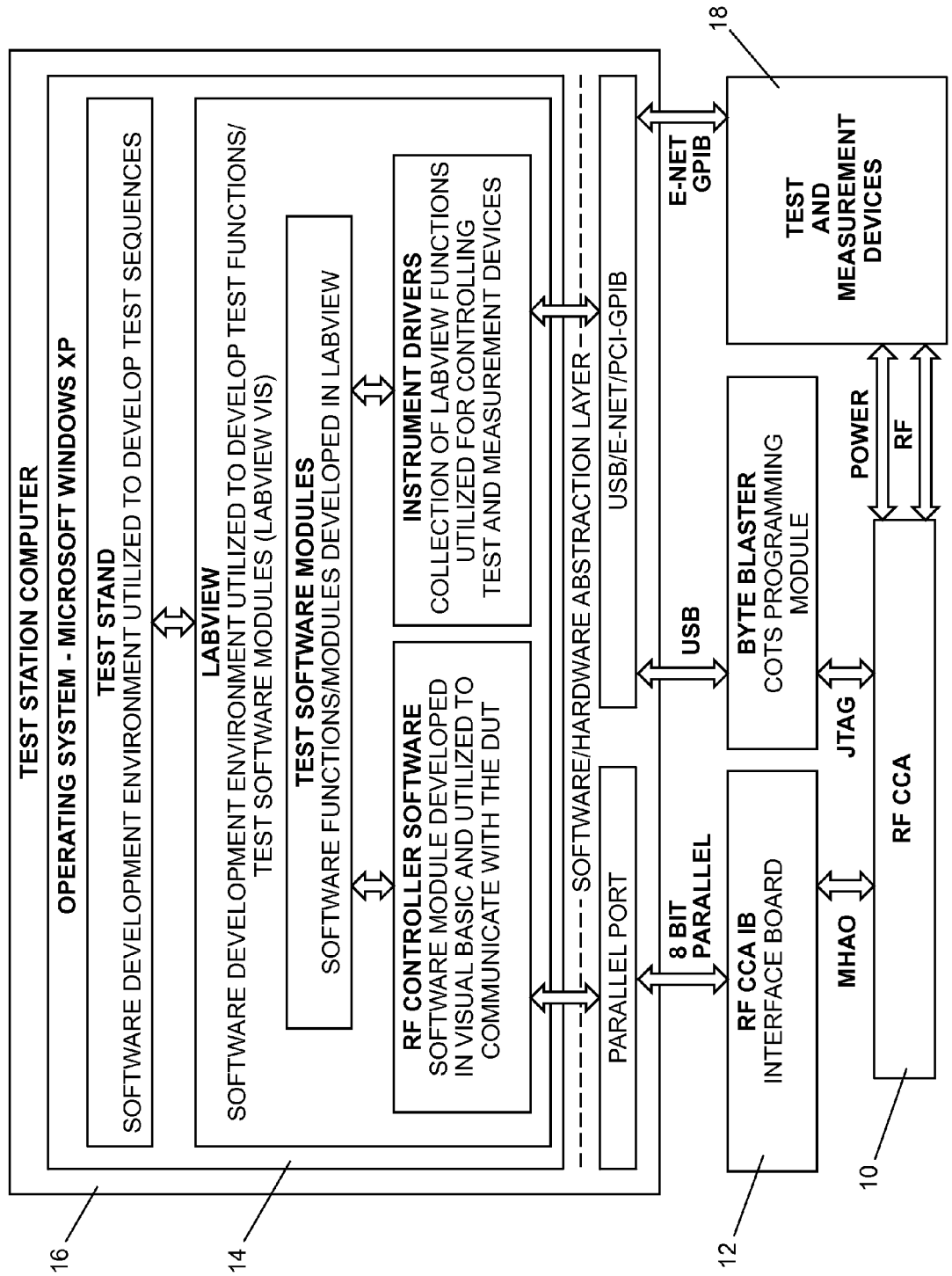
FIG. 2 is a block diagram of physical and logical connections among a computer running a test program, a unit under test (UUT), and test and measurement instruments.
Figure 3:
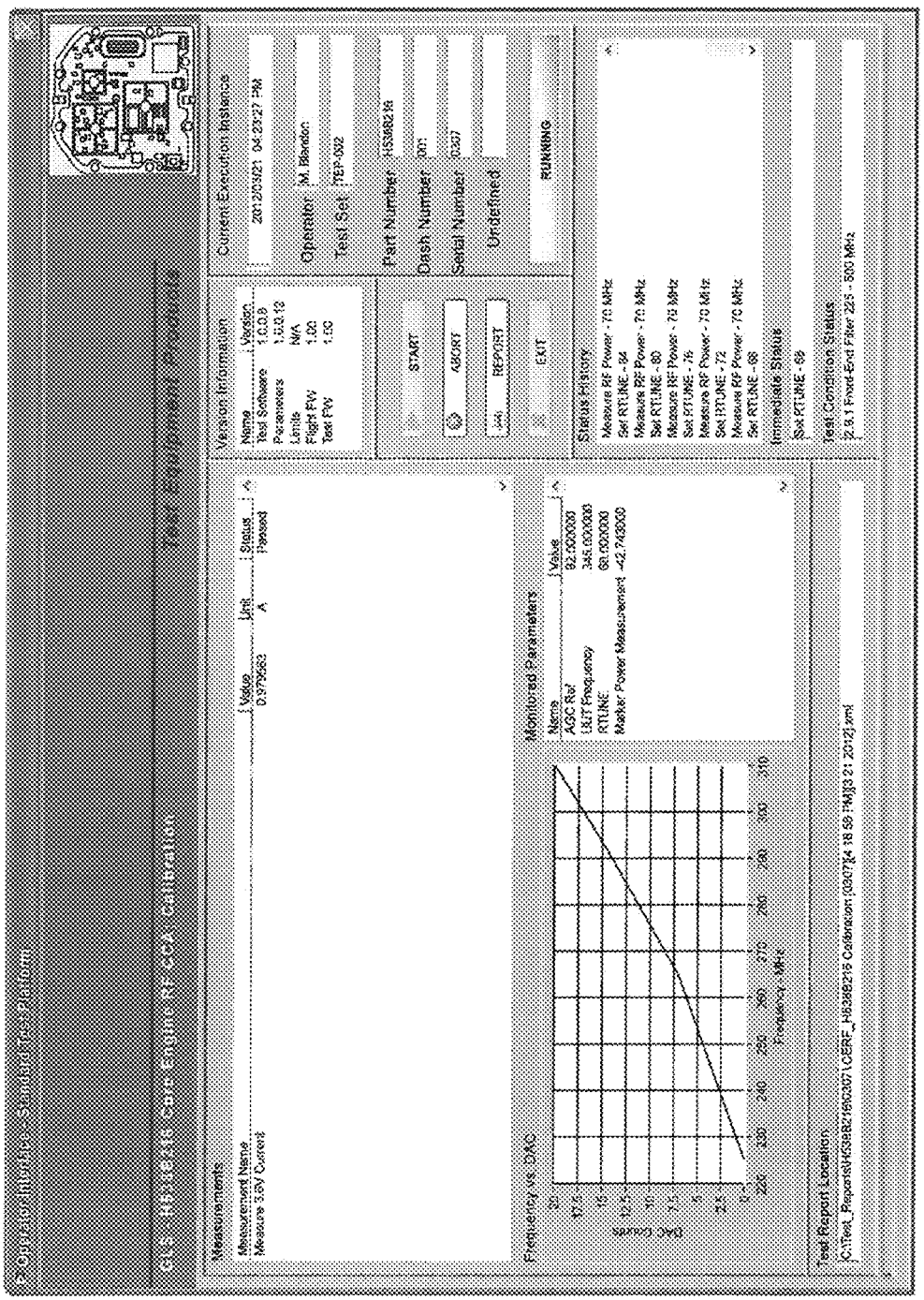
FIG. 3 is a screen displayed by the test program on the computer as part of a user interface.

FIG. 2 is a block diagram illustrating physical and logical connections among the programmed computer 16, the adapter board 12, the CCA 10 under test, and test and measurement devices 18 including one or more power supplies, signal generators, spectrum analyzers, and oscilloscopes. FIG. 3 is an example of a screen display that forms part of the GUI of the test program 14.

Figure 4:
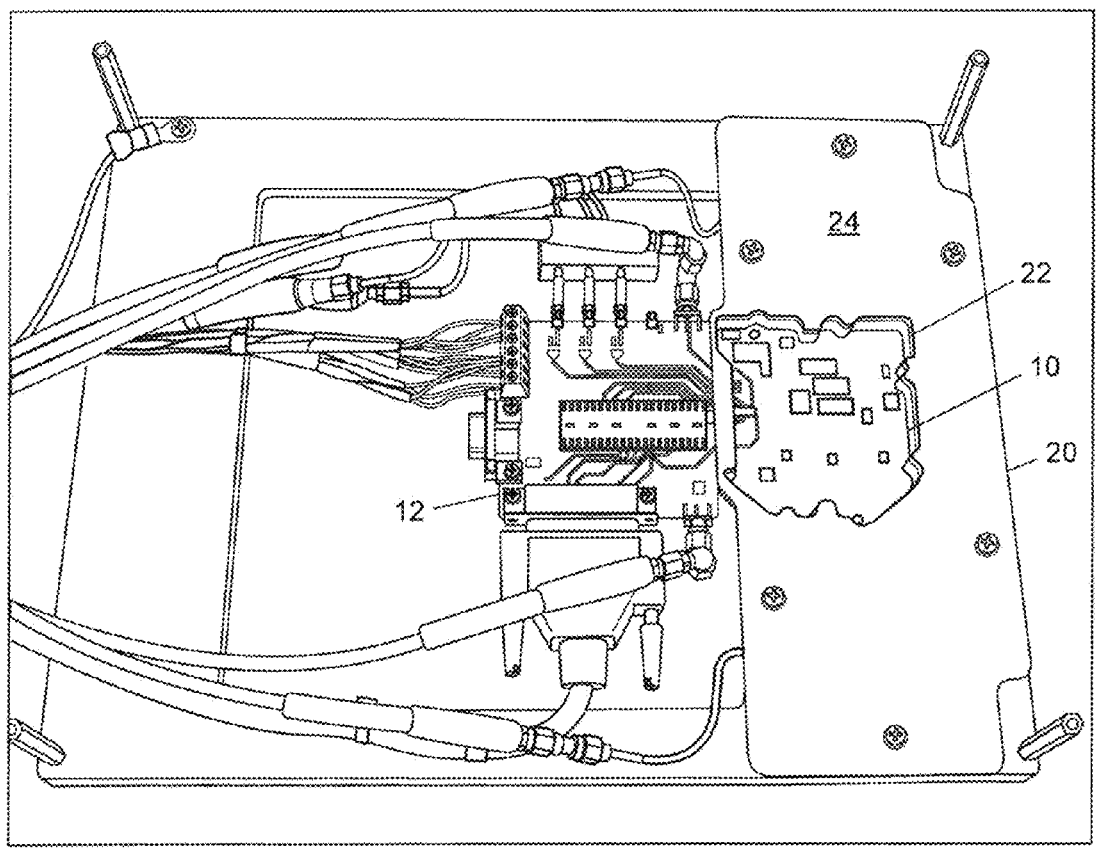
FIG. 4 shows a test fixture for the UUT.
Figure 6A:
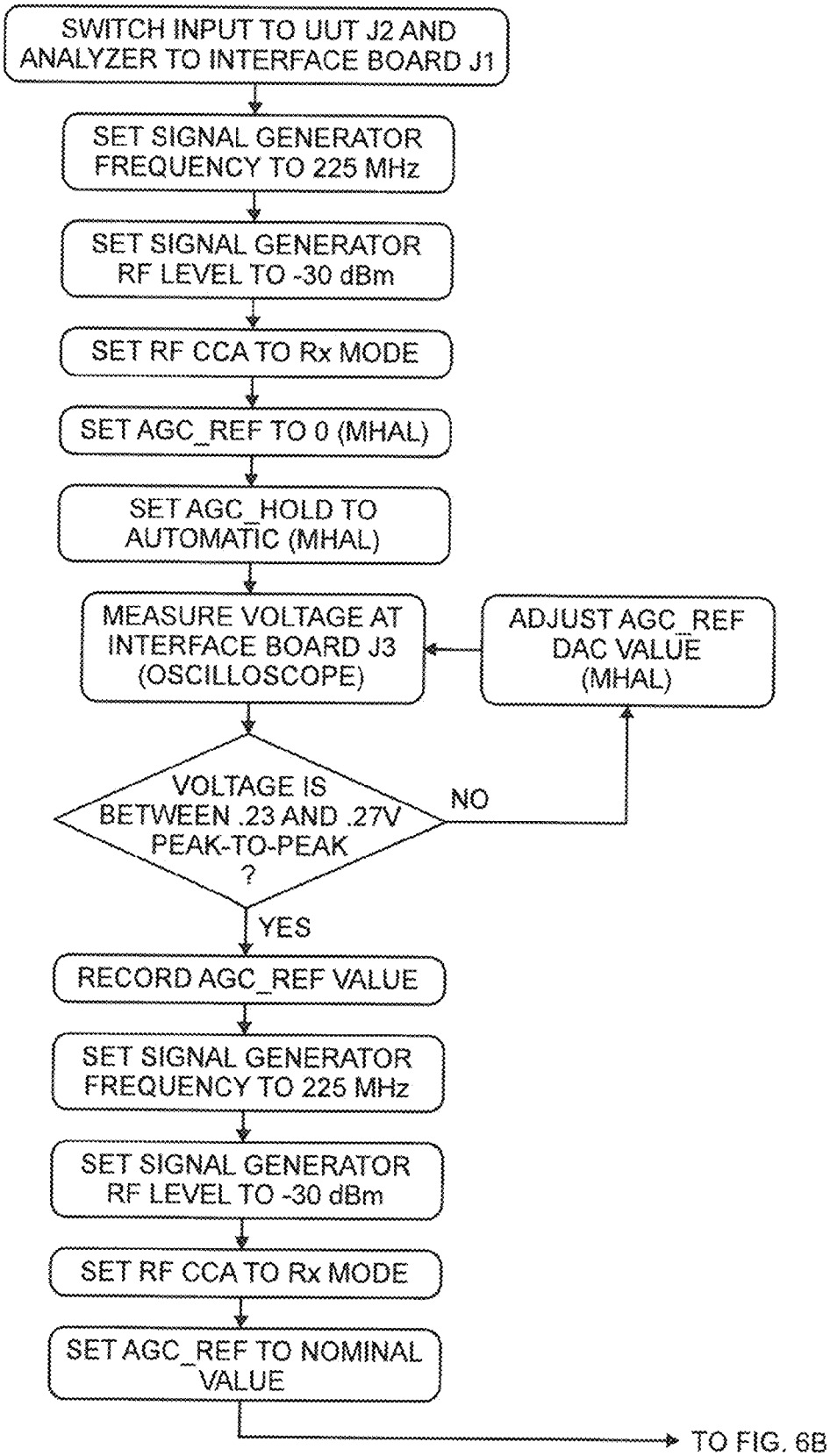
FIGS. 6A to 6D show steps of the write operation in FIG. 5.
Figure 6B:
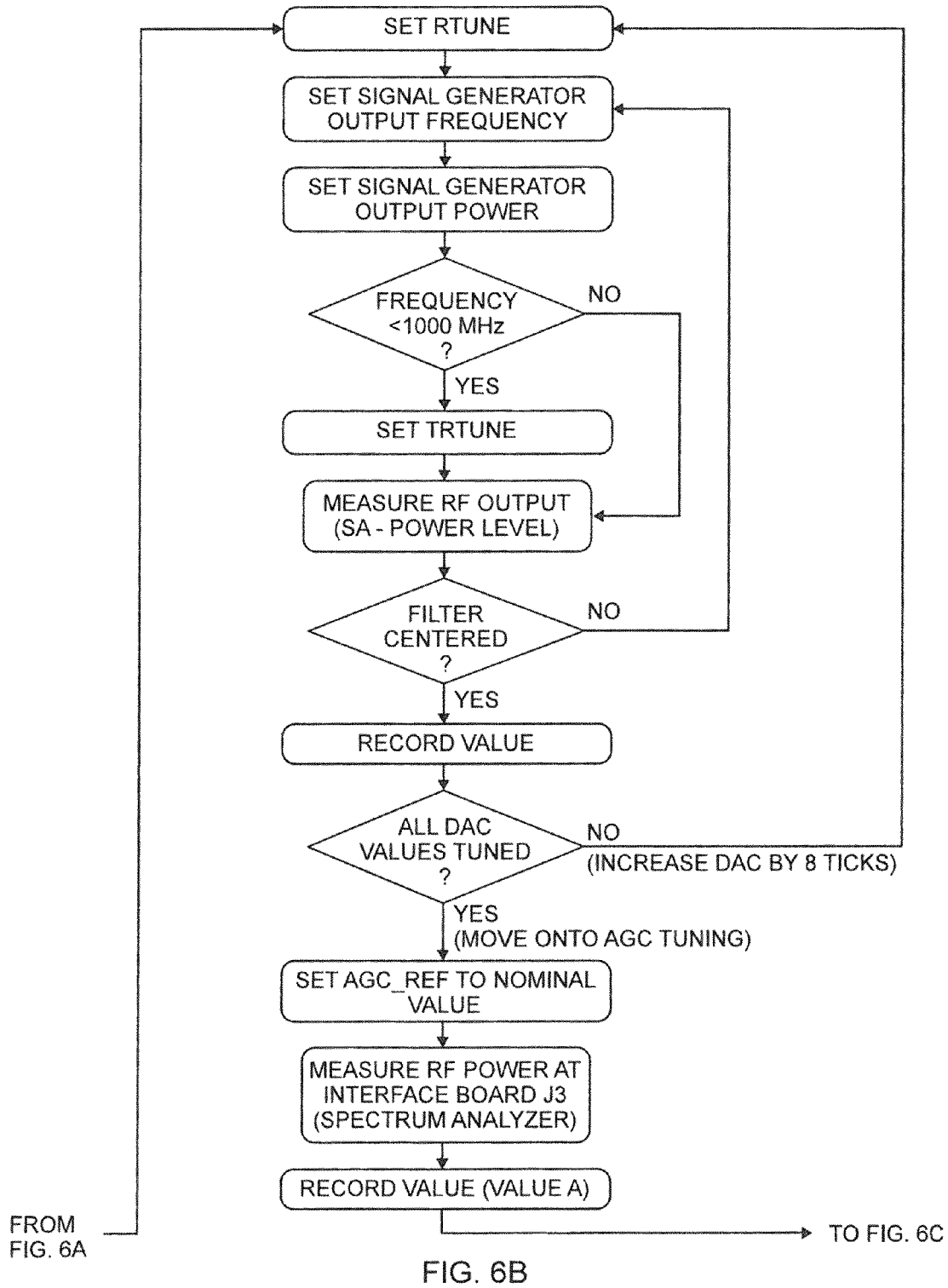
Figure 6C:
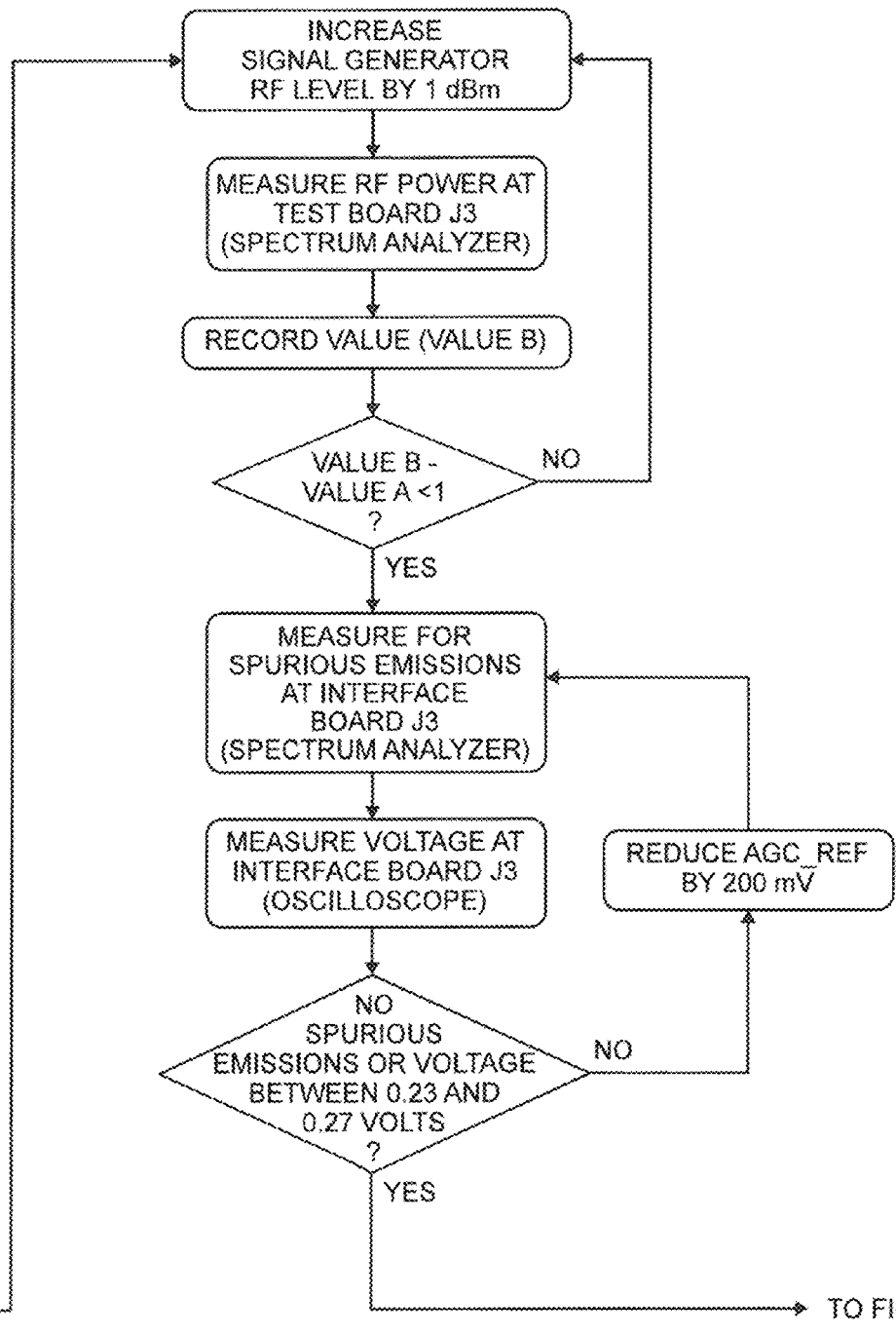
Figure 6D:
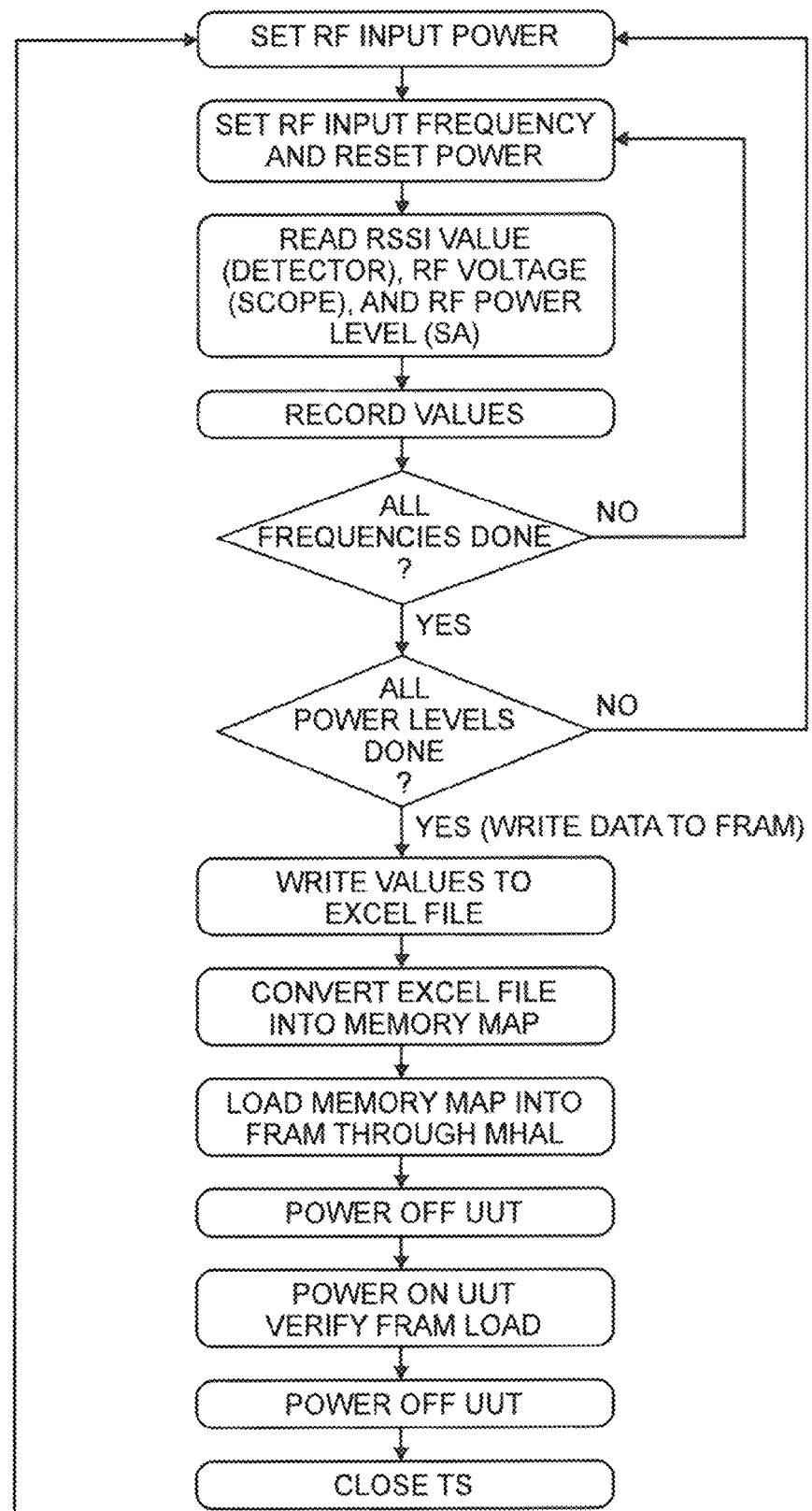
Figure 7A:
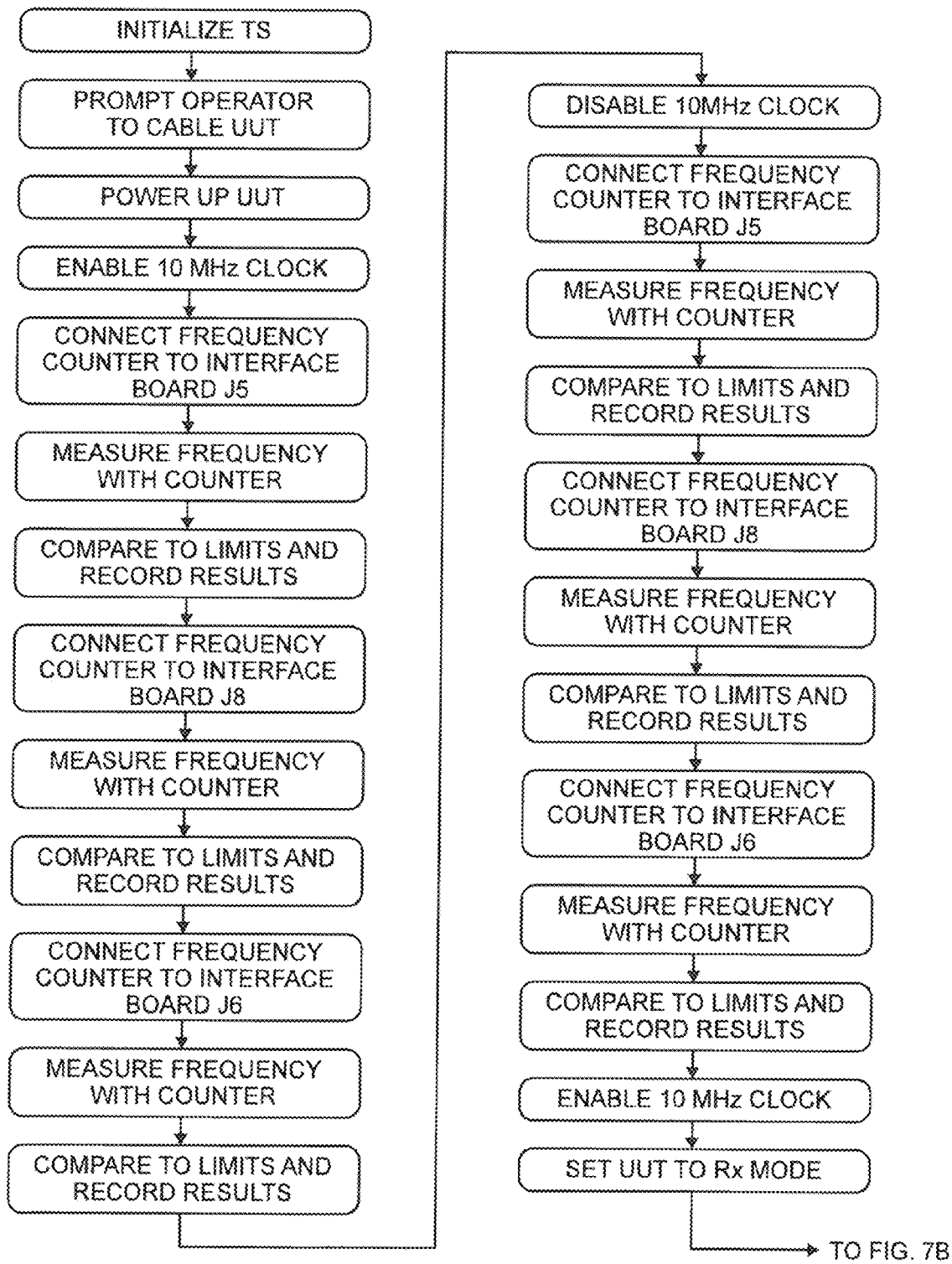
FIGS. 7A to 7E show steps of a test procedure for the UUT.
Figure 7B:
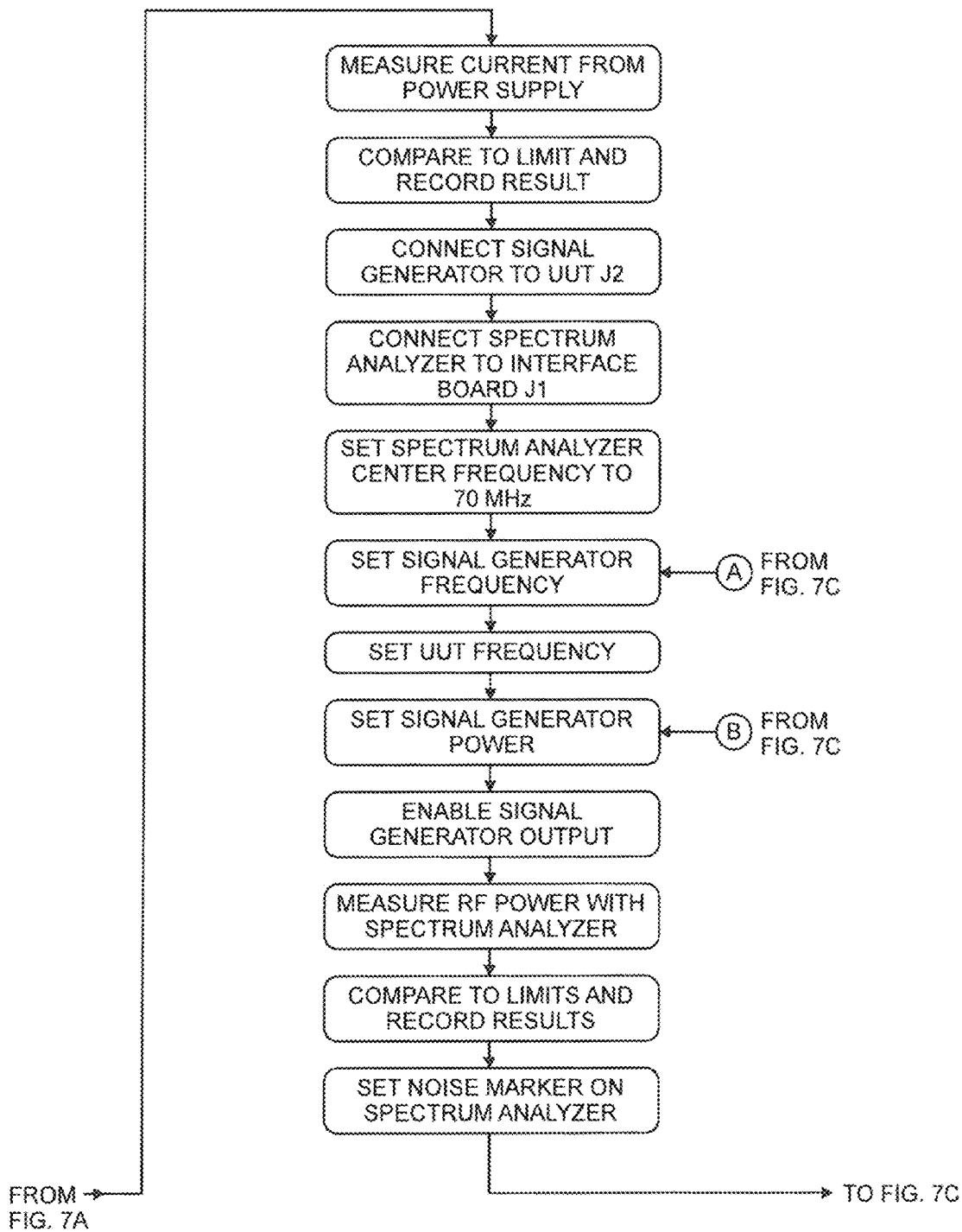
Figure 7C:
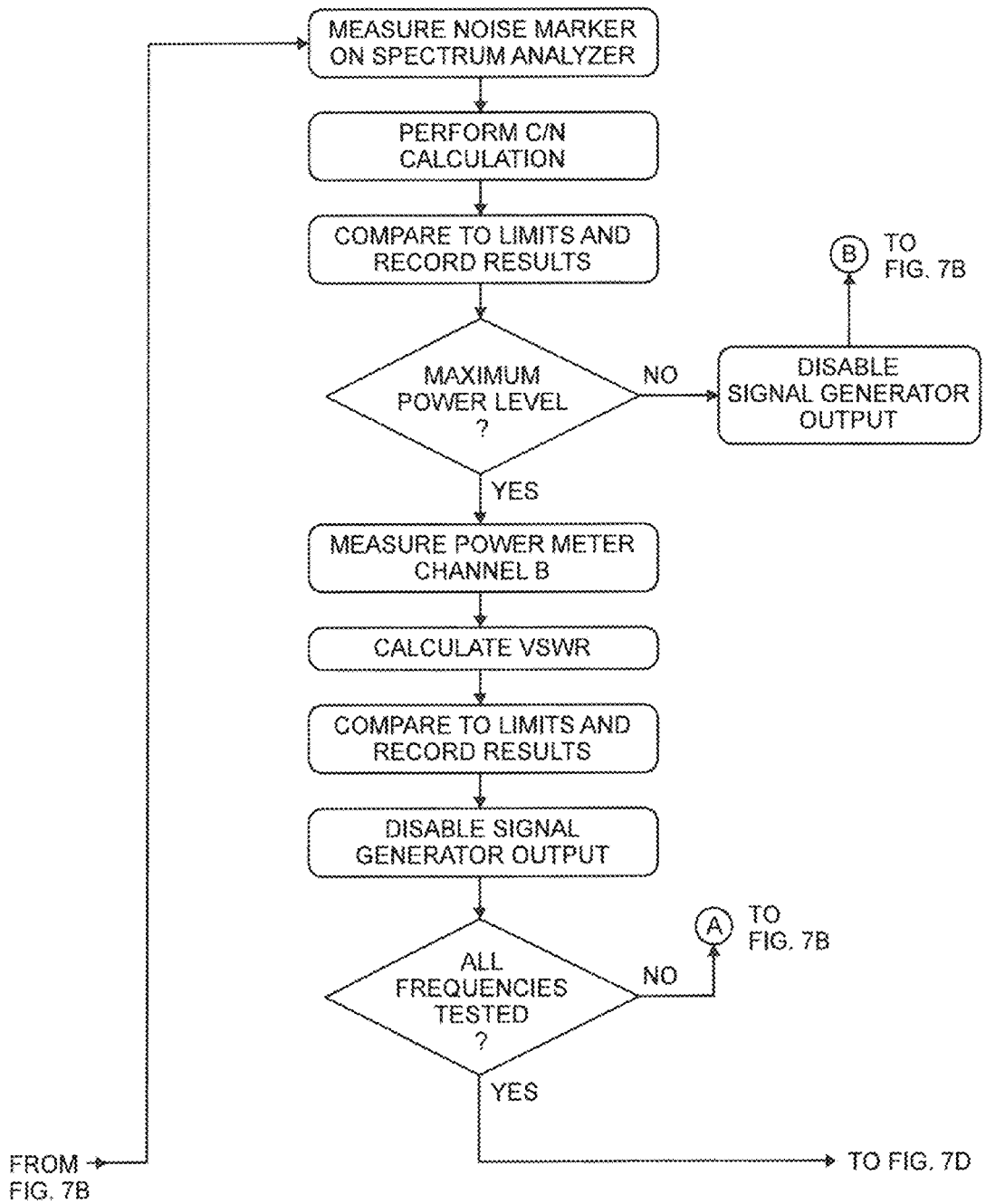
Figure 7D:
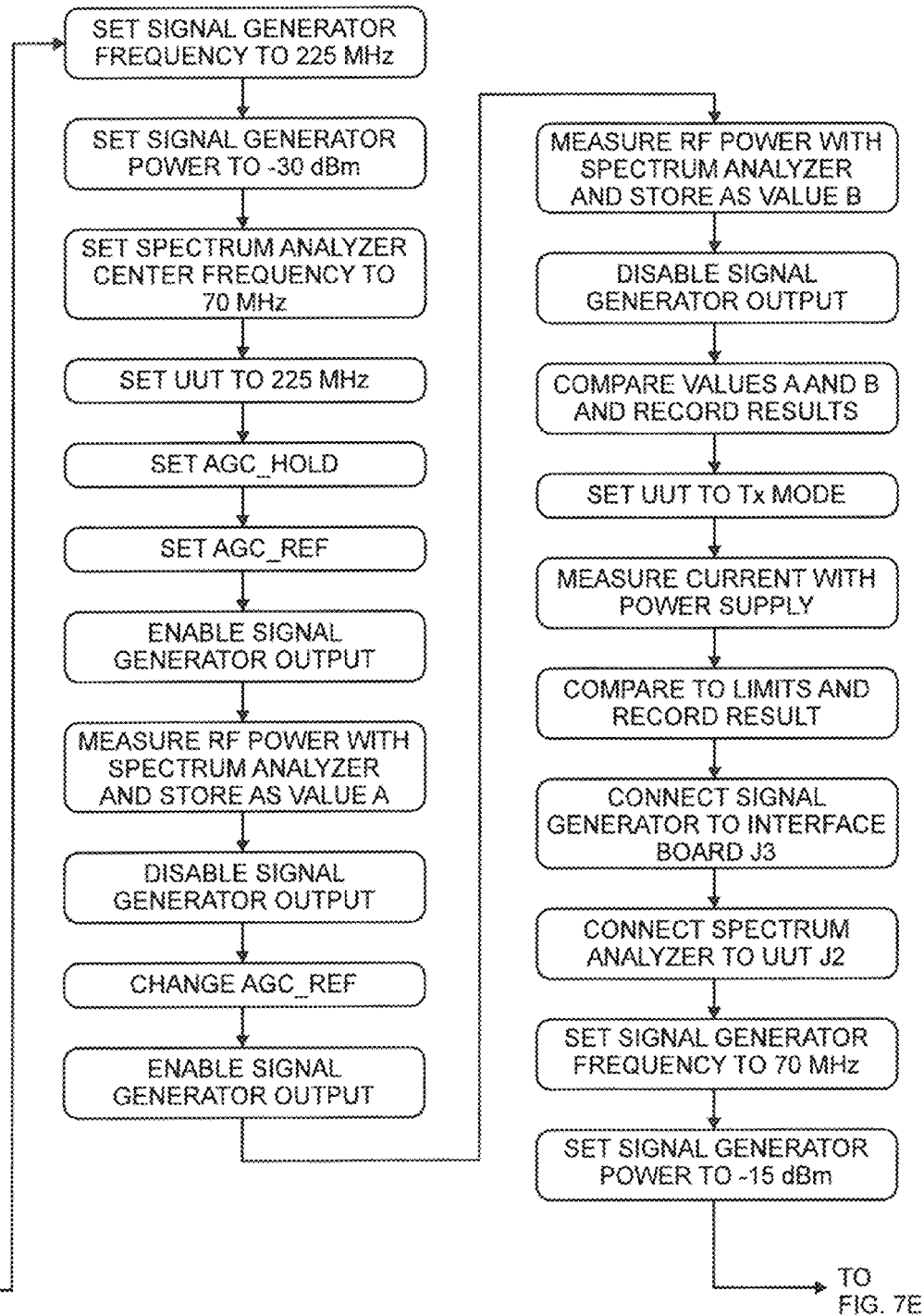
Figure 7E:
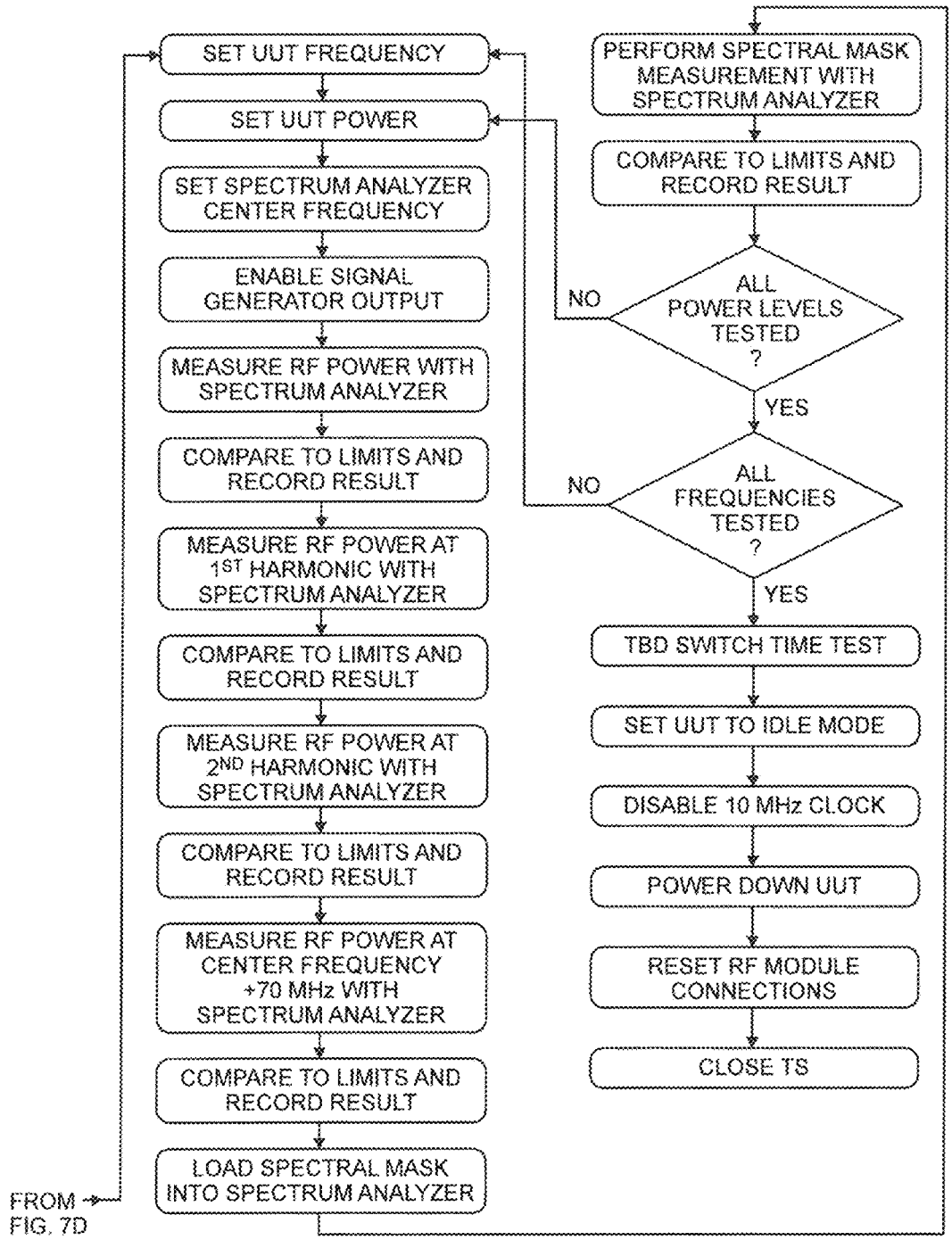

FIG. 4 shows a partially uncovered mechanical test fixture 20. The CCA 10 under test is mounted beneath a cutout 22 in a fixture cover panel 24, and the adapter board 12 is connected at the left side of the CCA 10 as viewed in FIG. 4. Various wires and cables shown in FIG. 4 are also routed among the CCA 10, the adapter board 12, the test station computer 16, and the test instruments 18, according to the paths shown in FIG. 2.

The adapter board 12 is constructed and arranged to use portions of existing signal paths on the CCA 10 to provide an interface between the signal paths and the computer 16 when running the test program 14. As shown in FIGS. 1 and 3, the test program GUI displays screens on the computer 16 that enable the operator to (a) direct power and test signals from the various instruments 18 to the CCA 10, (b) direct responsive output signals from the CCA 10 back to the instruments 18 for measurement, (c) adjust the test signals if necessary, and (d) store final values or settings. As a result, the CCA 10 can be tested and calibrated easily and quickly over many ranges of operating frequencies, power levels, and temperatures, and in a way that is more reliable than if performed manually.

The test program 14, the test station computer 16, and the adapter board 12 interoperate with the CCA 10 under test to form an automated feedback loop in the following manner. The test program 14 sends control commands via the computer 16 to the test instruments 18 to send power up, RF, and other signals to the CCA to activate the CCA 10 and to test and calibrate selected circuit paths and operating parameters of the CCA. See FIG. 2. Feedback paths are defined on the CCA 10 to direct corresponding output signals produced at various locations along the targeted transmit and receive paths, back to the test instruments 18 where the signals are measured. The test program 14 on the computer 16 compares the output signals with preset threshold levels for each selected operating parameter. If the results are outside the preset levels, the test program sends commands to adjust the test signals from the instruments 18 until the measured values are within the threshold levels for each selected operating parameter.

Once the measured values for a selected parameter are within the preset levels, the value(s) of the corresponding signals generated and measured by the test instruments 18 for the parameter are written by the computer 16 to be stored in a memory, e.g., a ferroelectric nonvolatile RAM (FRAM) that is preferably disposed on the CCA 10 itself. FIG. 5 is an example of a portion of a FRAM table write to CCA 10 operation, and FIGS. 6A to 6D show steps of the write to FRAM operation.

Examples of parameters that may be tested, adjusted, and stored for the CCA 10 as a function of frequency, temperature, and power level include, without limitation:

1. Voltage settings for RF and intermediate frequency (IF) voltage tuned filter (VTF) components of the CCA 10.
2. Settings associated with an automatic gain control (AGC) receive signal strength indicator (RSSI) curve.
3. Transmitter pre-amplifier and final amplifier bias voltages to control RF amplifier gain.
4. Automatic level control (ALC) settings to maintain the transmit output power level within a required range.
5. Phase-locked loop calibration of relative RF output phase with respect to a reference signal.

Figure 8:
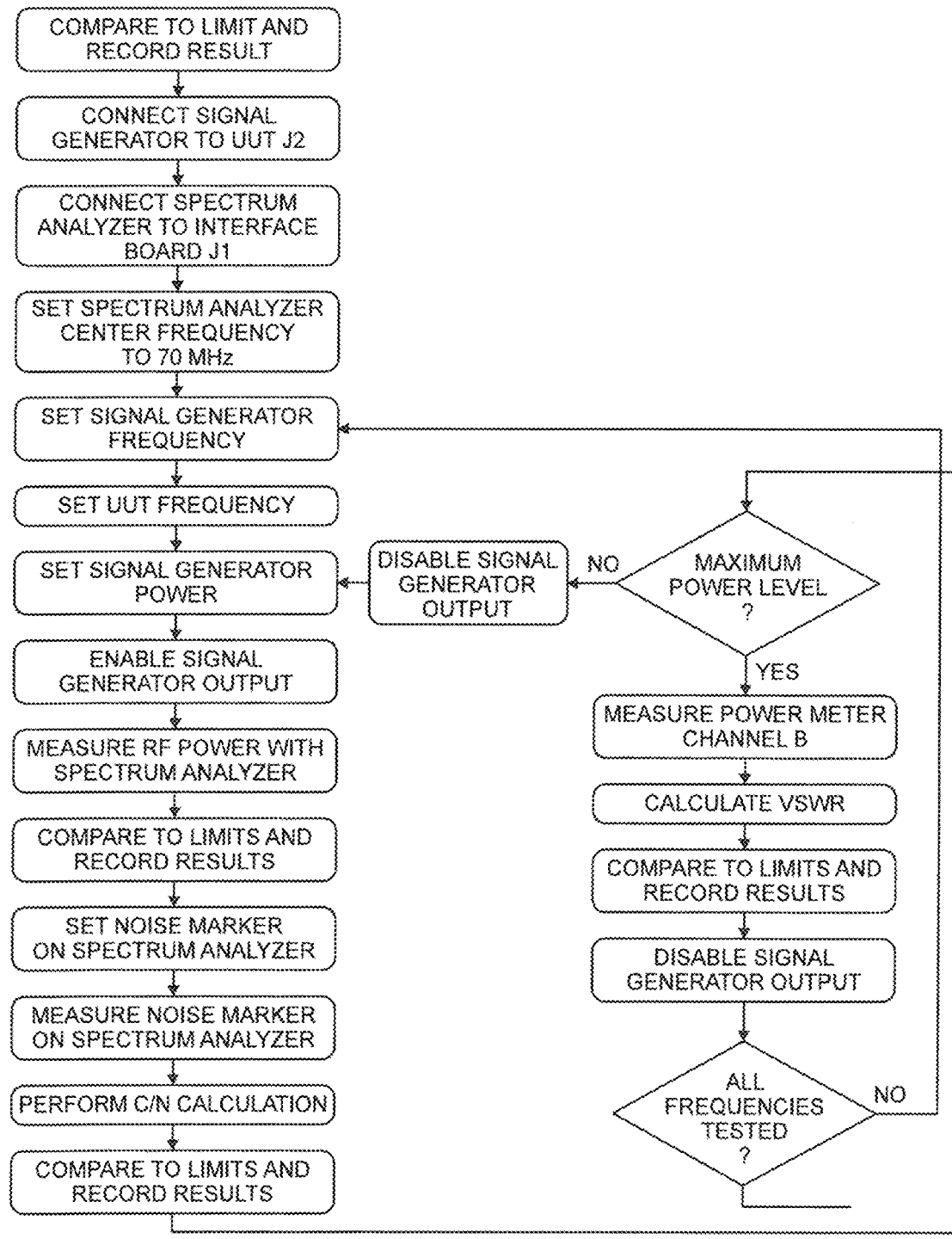
FIG. 8 shows steps of an equipment receiver (Rx) gain test as part of the test procedure in FIGS. 7A & 7B.

FIGS. 7A to 7E show steps of a complete test procedure for the CCA 10. On startup, the test program 14 prompts the operator to attach the cables and to power up the CCA 10, i.e., the unit under test or UUT. As shown in the drawing, further steps of the program 14 control the adapter board 12 and the instruments 18 for testing various stages of the CCA 10 sequentially, comparing the test results to preset limits, and recording the results. FIG. 8 shows those steps in the overall test procedure of FIGS. 7A to 7E in which a receiver (Rx) gain test is performed on the CCA 10.

Figure 9:
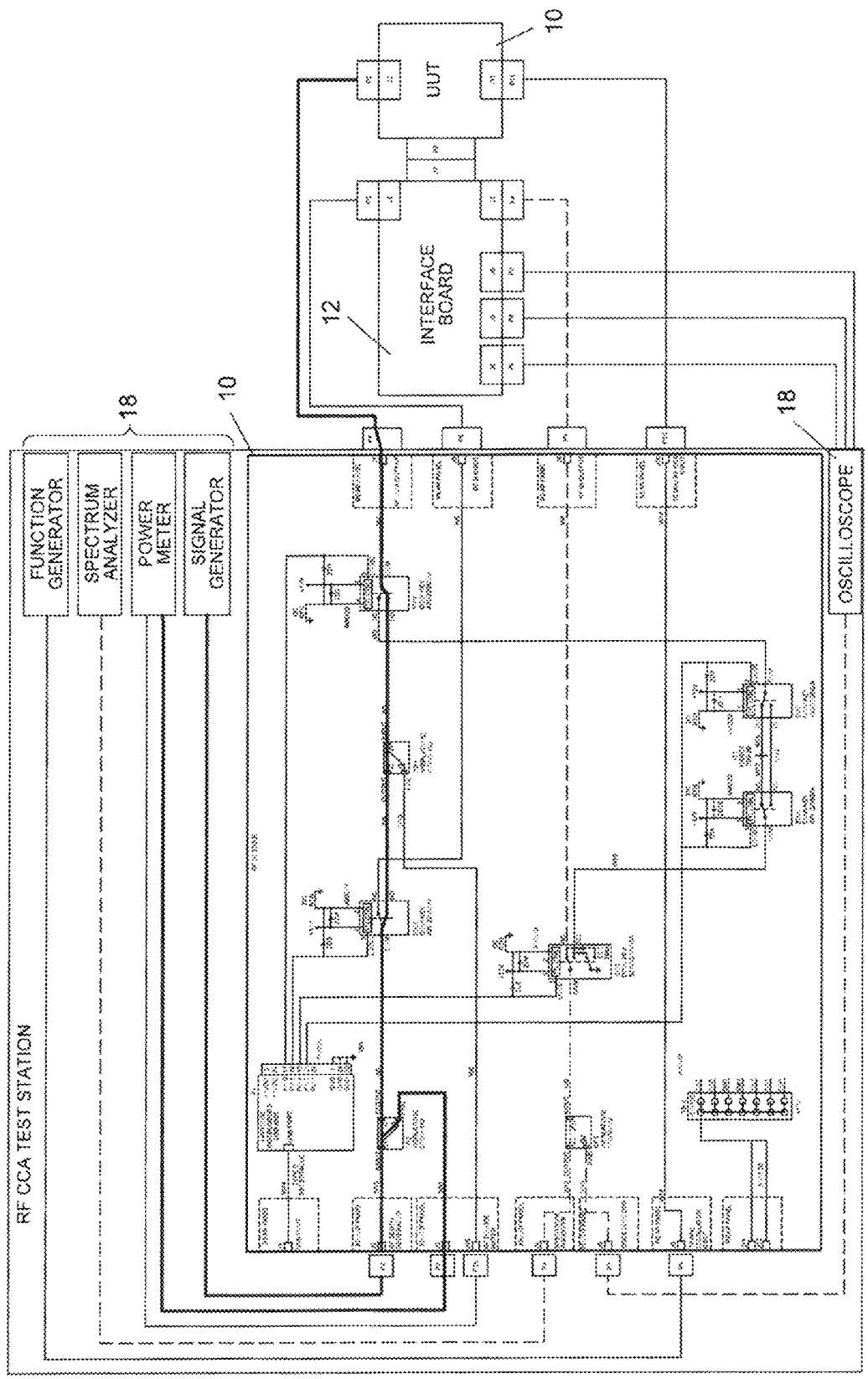
FIG. 9 is a block diagram showing an interface at a station for the test and measurement instruments.
Figure 10A:
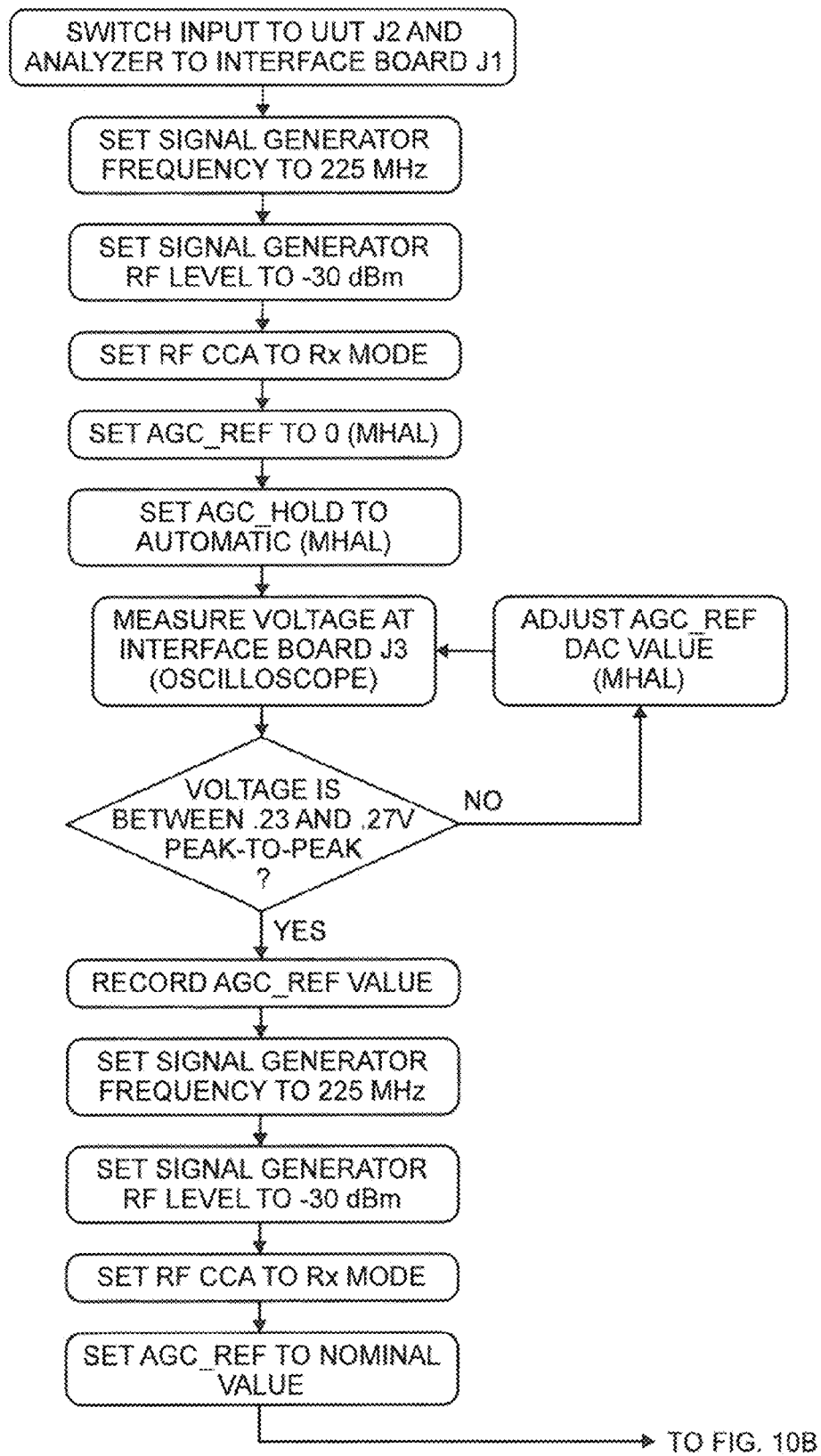
FIGS. 10A to 10D show steps of a calibration procedure for receiver components of the UUT.
Figure 10B:
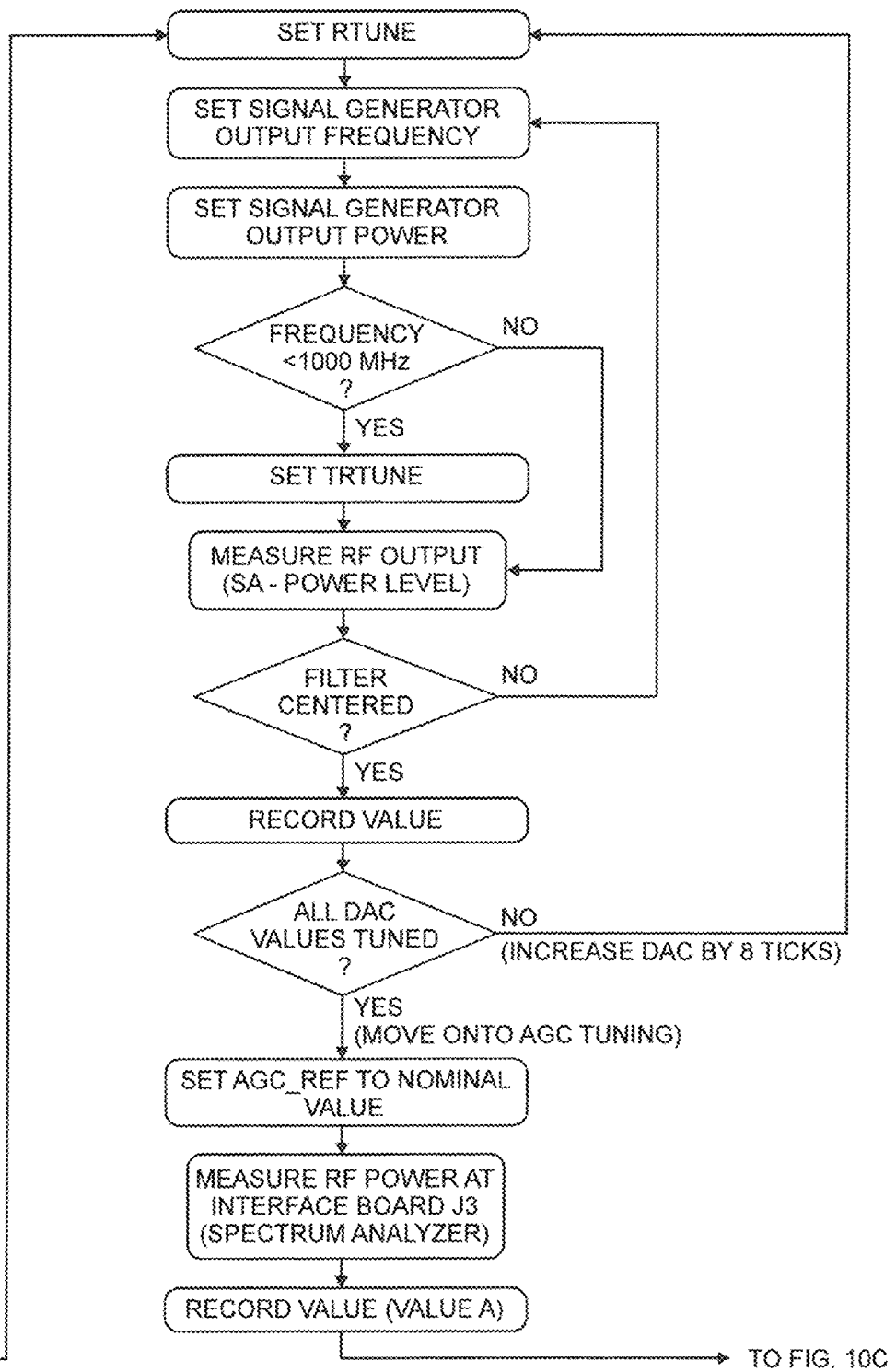
Figure 10C:
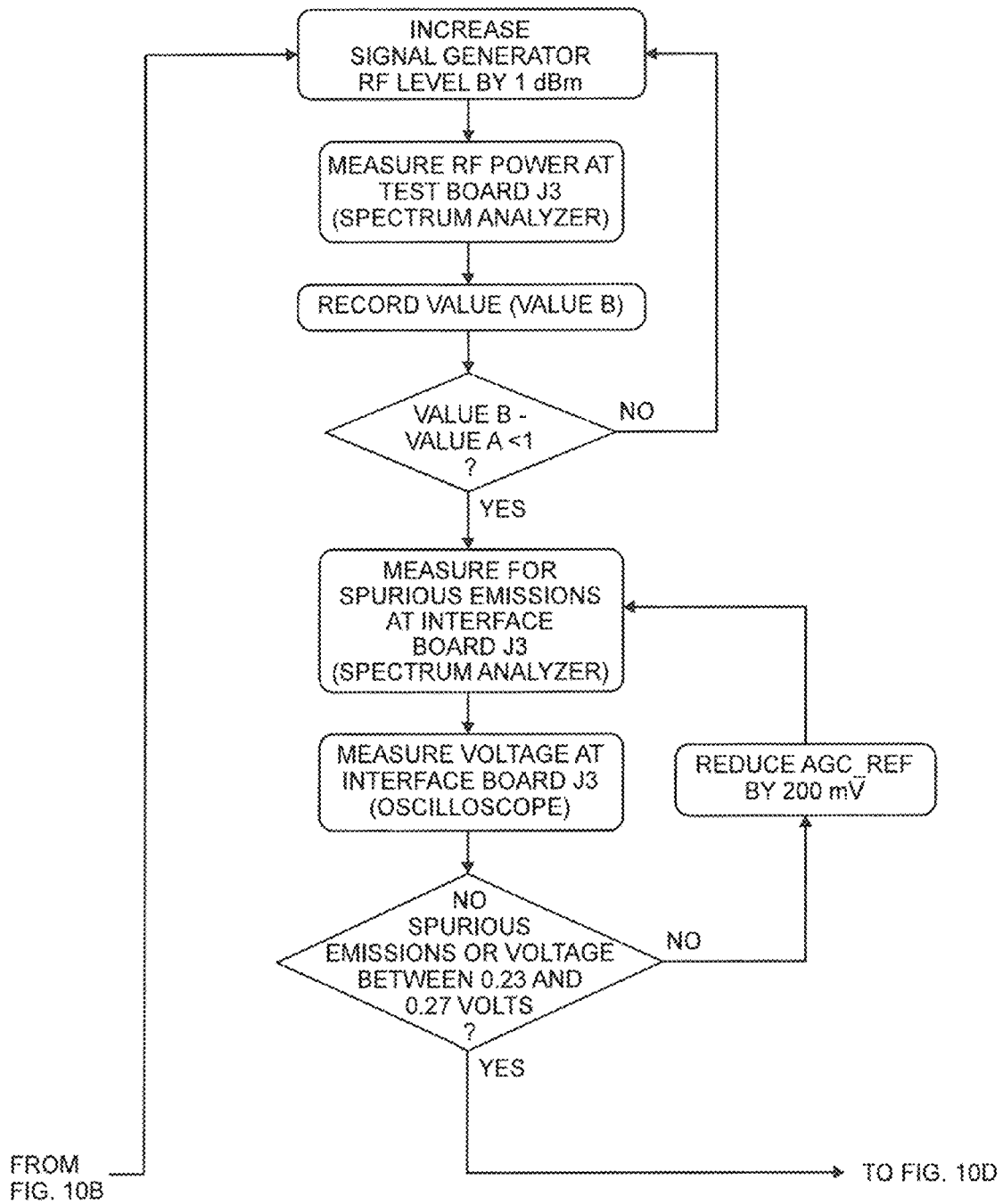
Figure 10D:
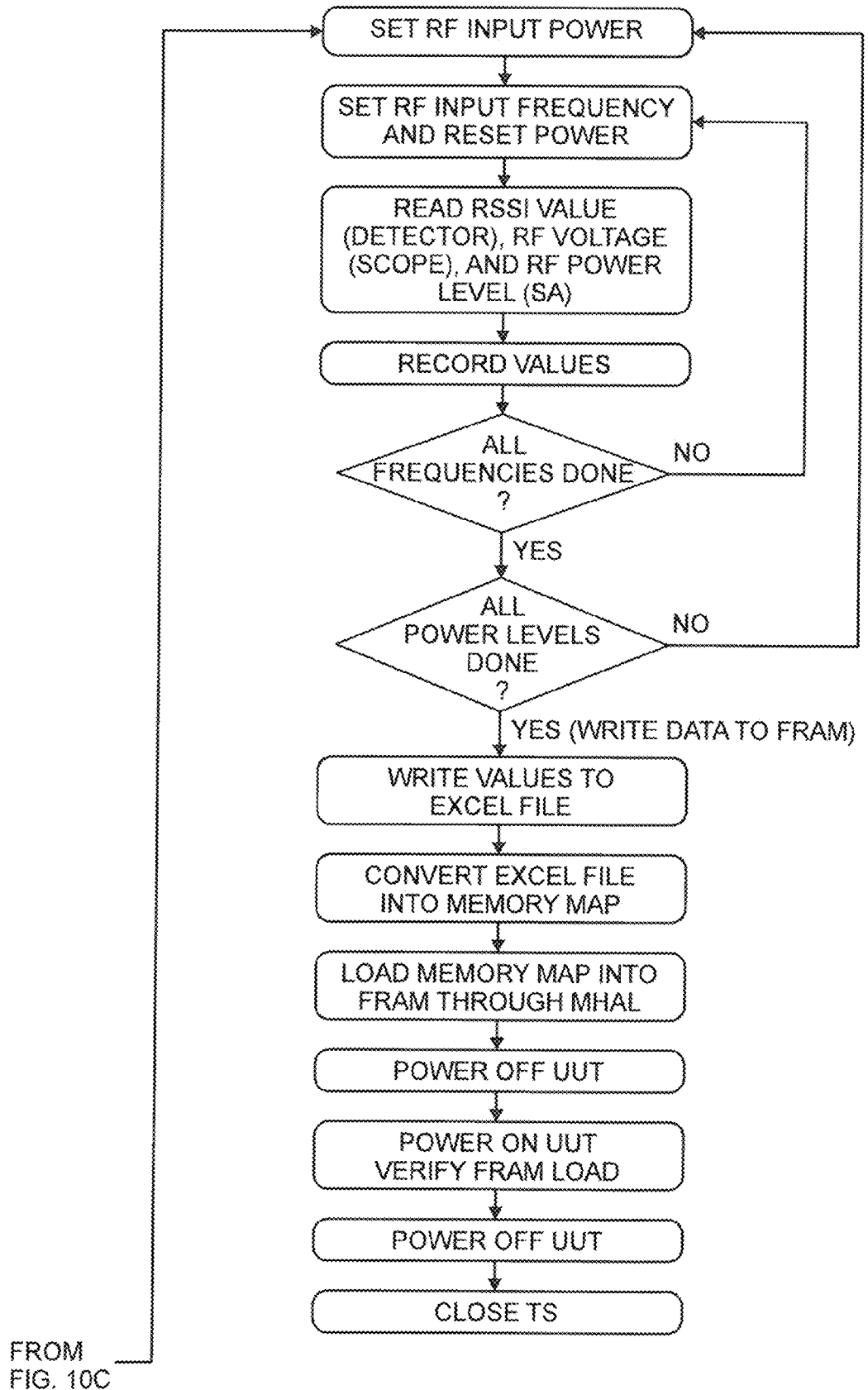
Figure 11A:
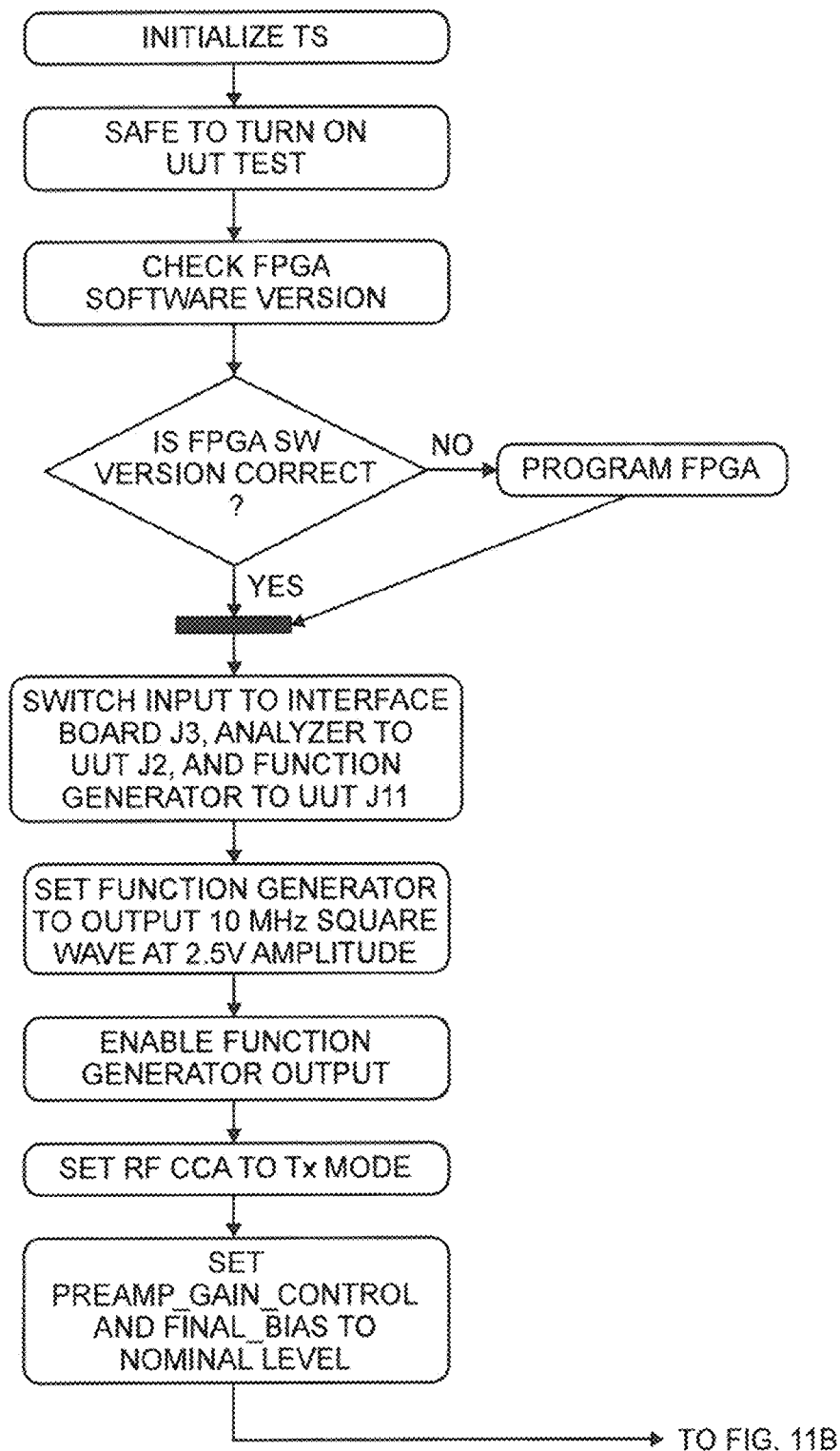
FIGS. 11A to 11D show steps of a calibration procedure for transmitter components of the UUT.
Figure 11B:
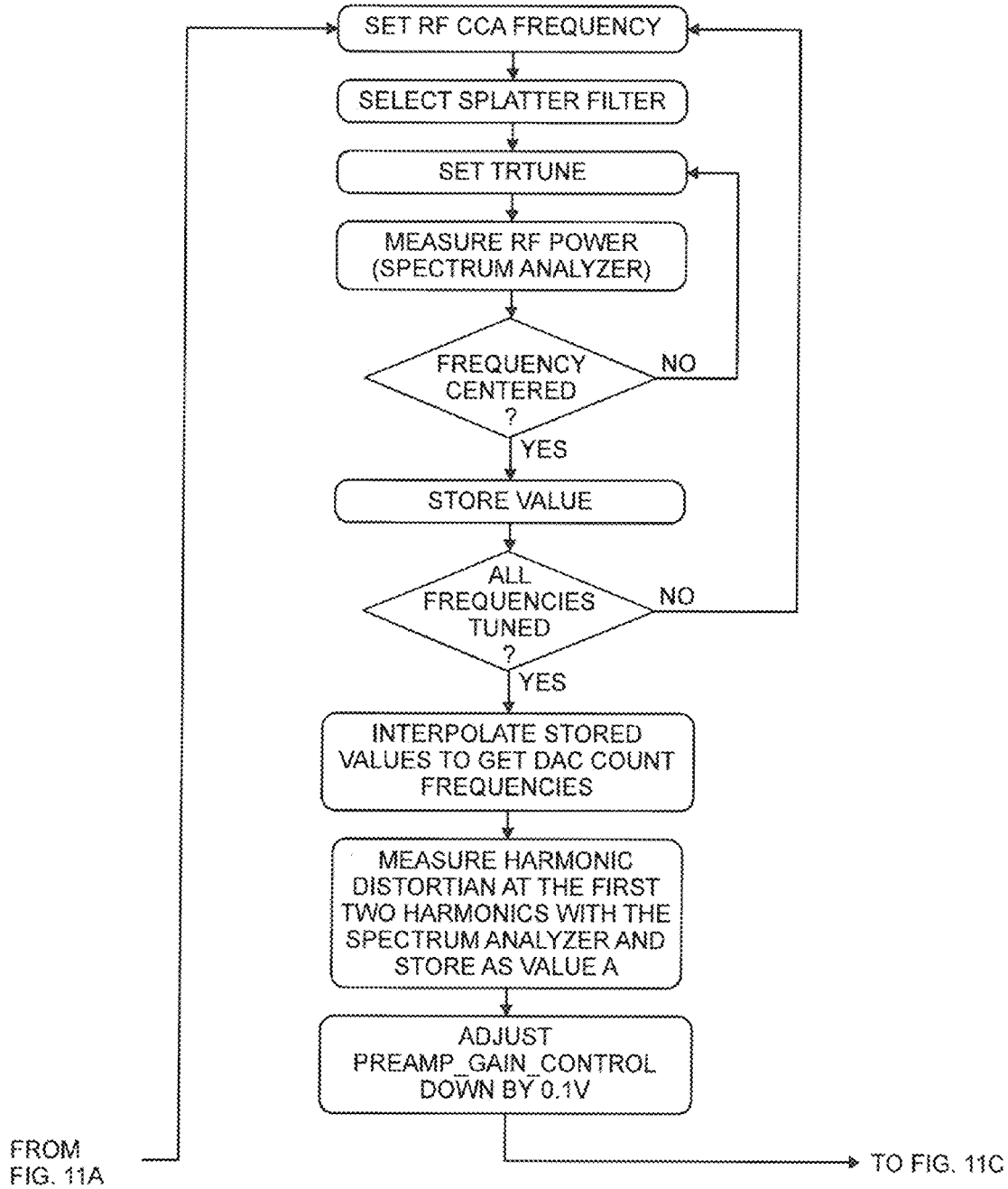
Figure 11C:
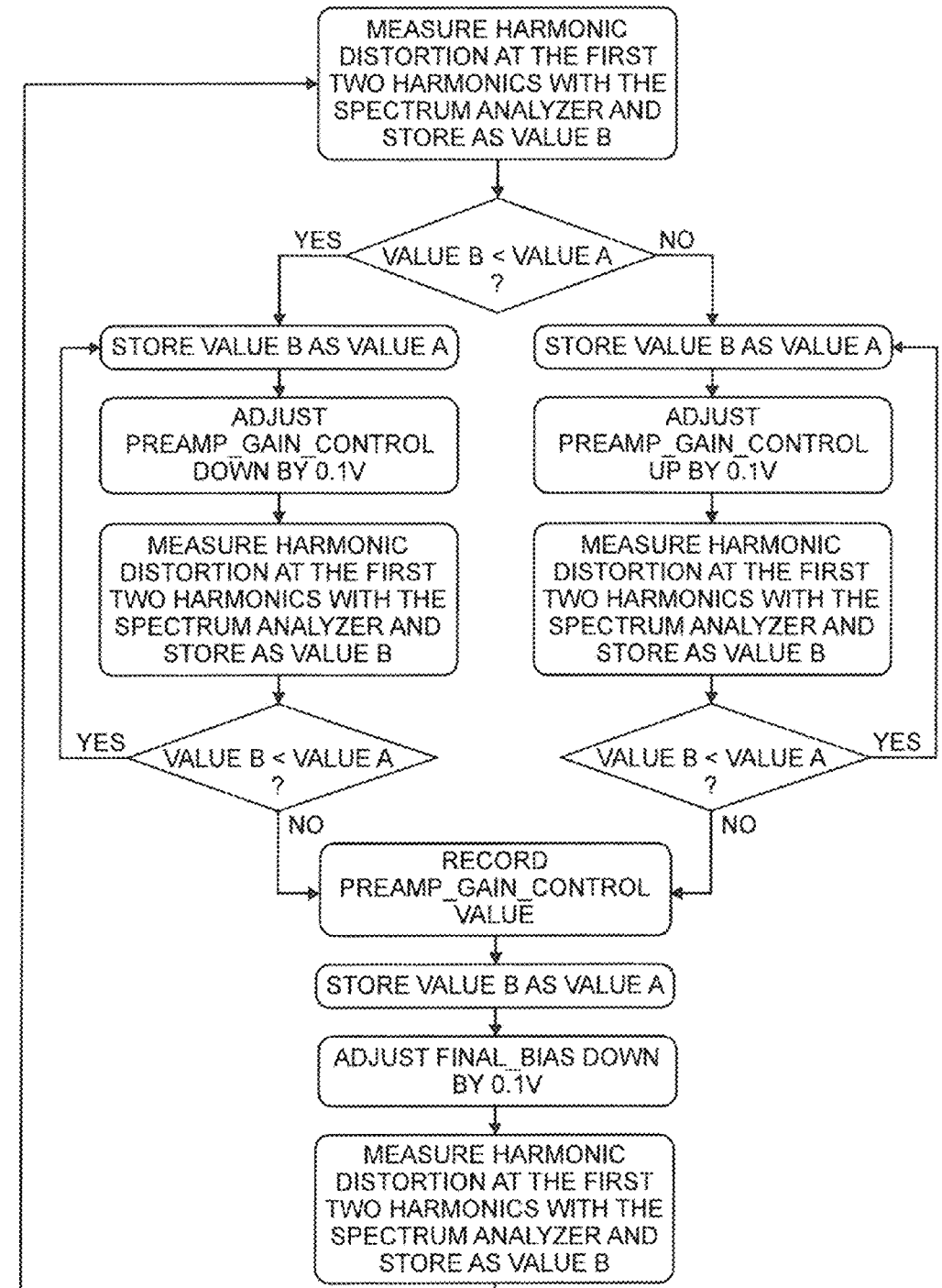
Figure 11D:
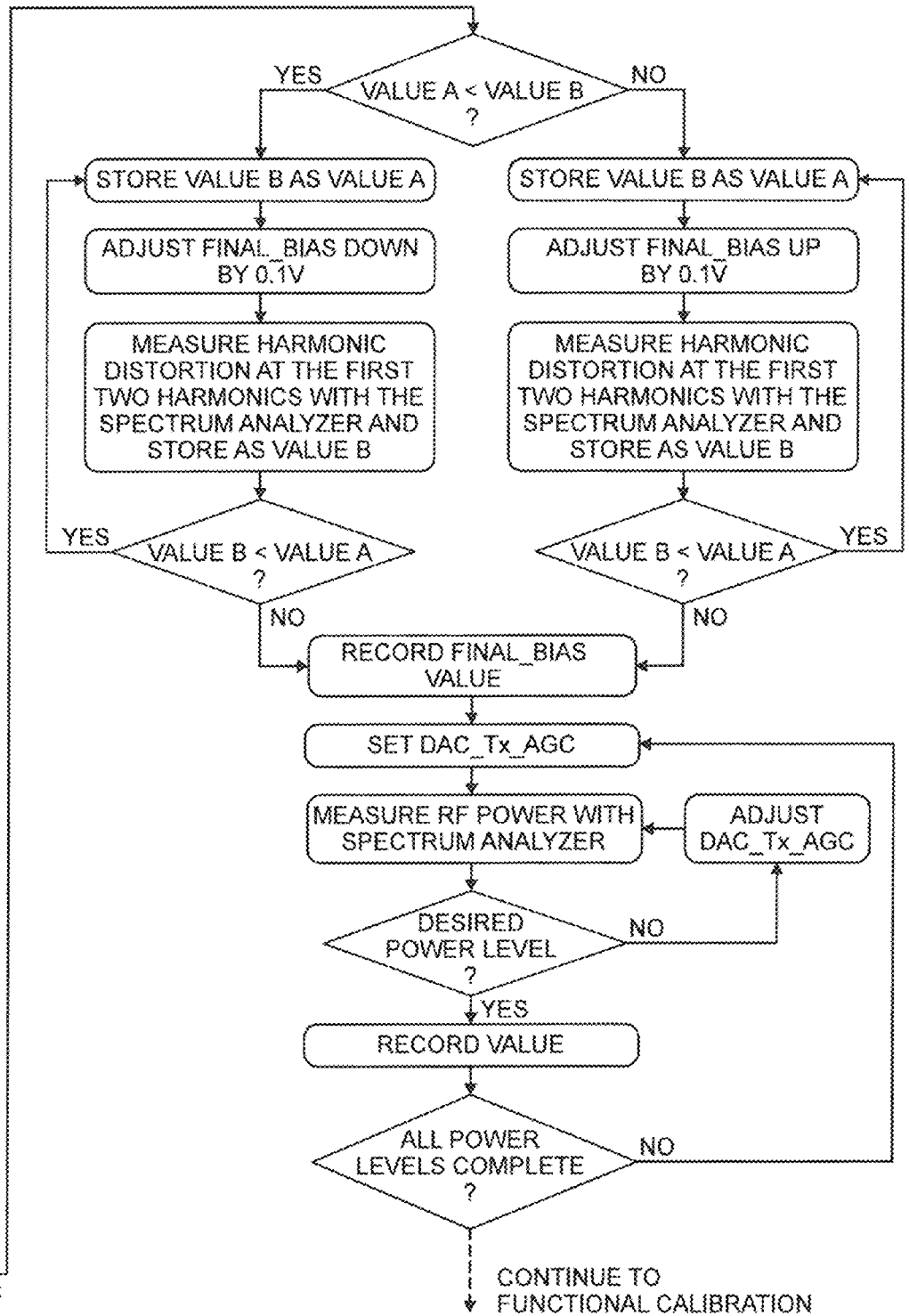

FIG. 9 shows an interface 30 that may be provided for the test and measurement instruments 18 at the test station 8. For example, in FIG. 9, test frequencies or tones are applied from a signal generator through the interface 30 to a connector provided on the UUT 10, and the power level of the applied tones is monitored by a power meter through a coupling path in the interface 30. Also in FIG. 9, output signals from the UUT 10 in response to the test tones, are directed through the adapter board 12 from the UUT 10 to a spectrum analyzer and an oscilloscope.

FIGS. 10A to 10D show steps of a calibration procedure that the test program 14 carries out for the receiver (Rx) components of the CCA 10, and FIGS. 11A to 11D show steps initiated by the test program 14 for calibration of transmitter (Tx) components of the CCA 10.

EXAMPLE ONE

Figure 12:
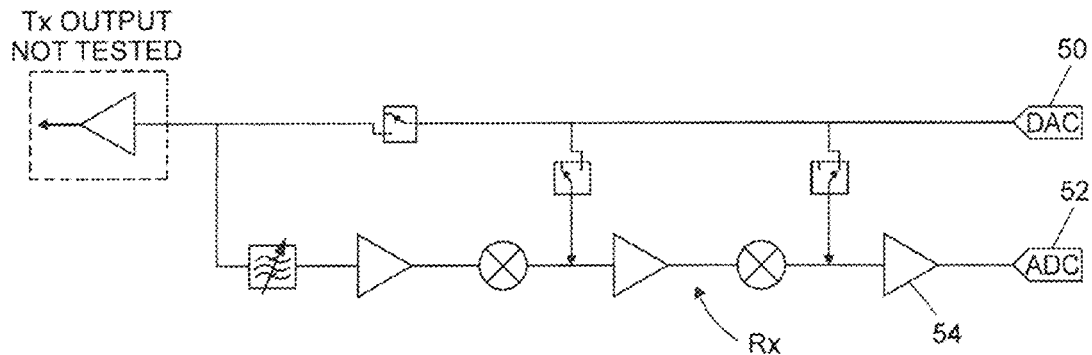
FIGS. 12 to 14 illustrate a sequence of steps of a built in test (BIT) procedure provided in the UUT.
Figure 13:
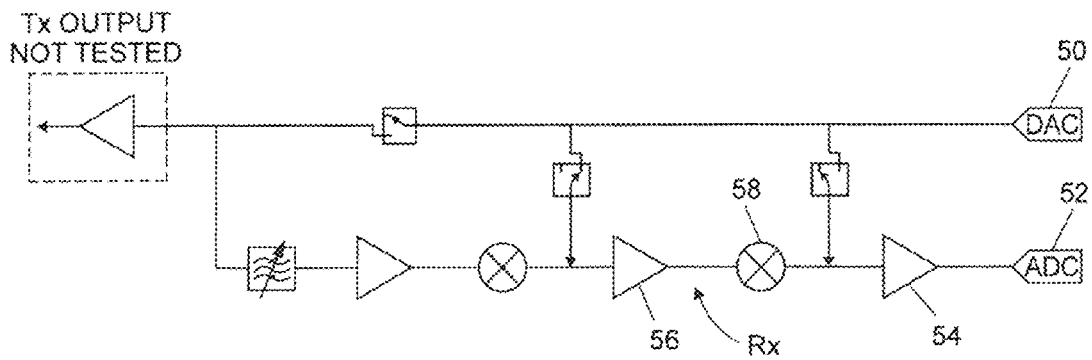
Figure 14:
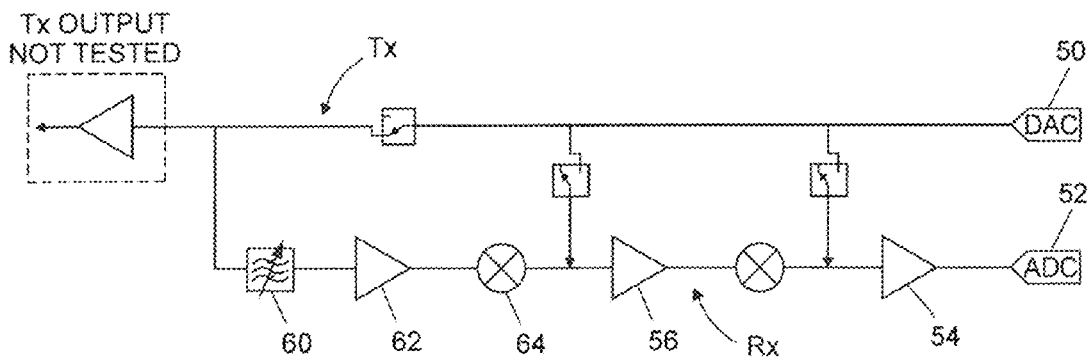

Built in Test (BIT) Loopback Functions (FIGS. 12 to 14)

Preferably, the CCA 10 is constructed and arranged with signal paths and circuits including switches that are operative to pass signals through selected components of the module in response to a set of "loopback" sequences that may be stored, for example, in a field programmable gate array (FPGA) component of the CCA 10. The switches operate to isolate certain portions of the Rx and the Tx chains of the CCA 10 and/or to bypass others. After the switches are set, the method of loopback is the same. The CCA 10 therefore preferably has a built-in-test capability as explained below.

Specifically, as seen in FIGS. 12-14, a component transmit digital-to-analog converter (DAC) 50 of the CCA 10 sequentially transmits one of several available waveforms to be applied at an input of a corresponding stage along the receiver (Rx) chain of the CCA. The applied waveform passes through the stage, and is returned through an existing path on the CCA to a component analog-to-digital converter (ADC 52) in the Rx chain. The returned waveform is post processed by a component waveform FPGA, and performance measurements such as bit error rate (BER) and other waveform quality parameters are derived. Three types of loopback tests are illustrated in FIGS. 12-14 using a simplified model of the CCA 10.

1. Second IF loopback test (FIG. 12). In this test sequence, a test waveform from the DAC 50 is applied to an input of a second IF amplifier 54 at the back end of the module's Rx chain. The waveform passes through the amplifier 54 and any associated filters without being subject to a mixing operation, to the ADC 52.

2. Second mixer loopback test (FIG. 13). In this sequence, a test waveform from the DAC 50 passes through a first IF amplifier 56, a second mixer 58, and the previously tested second IF amplifier 54 and filters to the ADC 52.

3. First mixer and front end loopback (FIG. 14). During this sequence, a test waveform from the DAC 50 is carried through the entire Rx chain, including front end filters 60, an RF amplifier 62, a first mixer 64, and the previously tested first IF amplifier 56 and successive stages, to the ADC 52.

If the transmit (Tx) chain of the CCA 10 has a relatively high output power (e.g., around 37 dBm), it would be desirable to omit a built in test of the final RF power amplifier (PA) stage(s) of the module due to potential damage of other module components.

EXAMPLE TWO

Filter Calibrations (FIGS. 15 to 19)

As explained above for the built-in-test procedure, switches provided in the CCA 10 enable certain sections of the Rx and the Tx chains to be isolated and others bypassed so that voltage tunable filters in the Rx/TX chain can be calibrated individually, i.e., the only component being tested and measured is the particular filter being calibrated. Once the filter is isolated from the Rx or Tx chain on the CCA 10, a series of test frequency tones are applied by the instruments 18 via the adapter board 12 to certain input terminals (e.g., an antenna terminal 68 or an IF terminal 69) of the CCA. The filter is voltage tuned via, e.g., a DAC to obtain a maximum response for each tone, and the digital word or count for the DAC that corresponds to the maximum filter response for the tone is stored, thus building a tuning curve for the filter. All AGC is set to a nominal value as it is not being calibrated. Preferred methods of calibrating the filters in the CCA 10 are detailed below.

Figure 15:
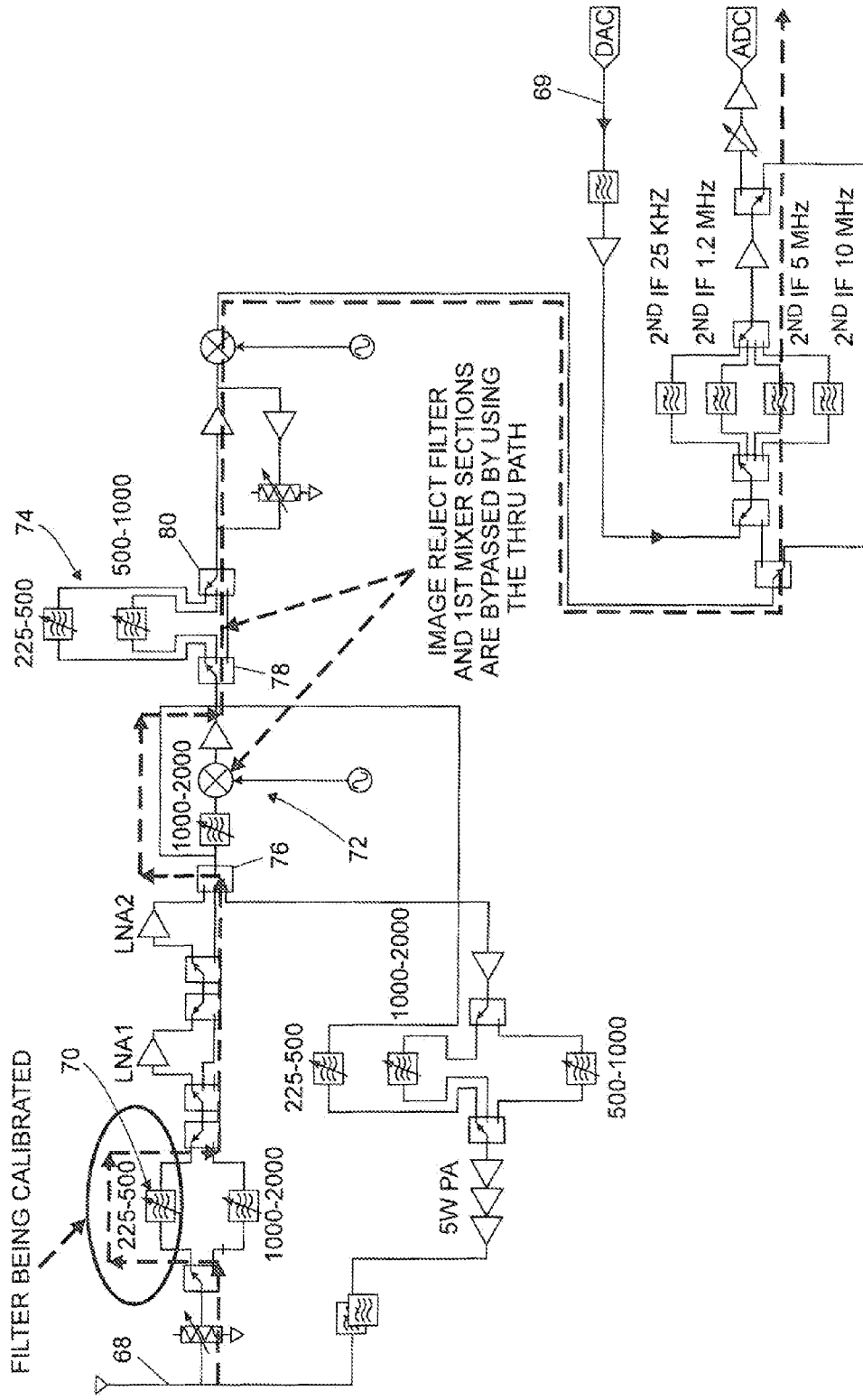
FIGS. 15 to 19 illustrate calibrations of component filters of the UUT.

FIG. 15 illustrates a calibration for a 225-500 MHz front end (FE) tunable filter 70 according to the invention. The CCA 10 is set to receive (Rx) mode, and a first mixer section 72 and an image reject filter bank 74 are both bypassed by operation of associated switches 76, 78, 80. A certain number of test frequency tones between 225 and 500 MHz are applied to the antenna terminal 68, and a through path for the output of the filter 70 back to the measurement instruments 18 (e.g., a spectrum analyzer) is defined through the adapter board 12 and the instrument interface 30 at the test station 8. The filter 70 is voltage tuned to obtain a maximum response for each tone, and the voltage (or DAC word count) that corresponds to the maximum response for each tone is stored to define a tuning curve for the filter 70.

Figure 16:
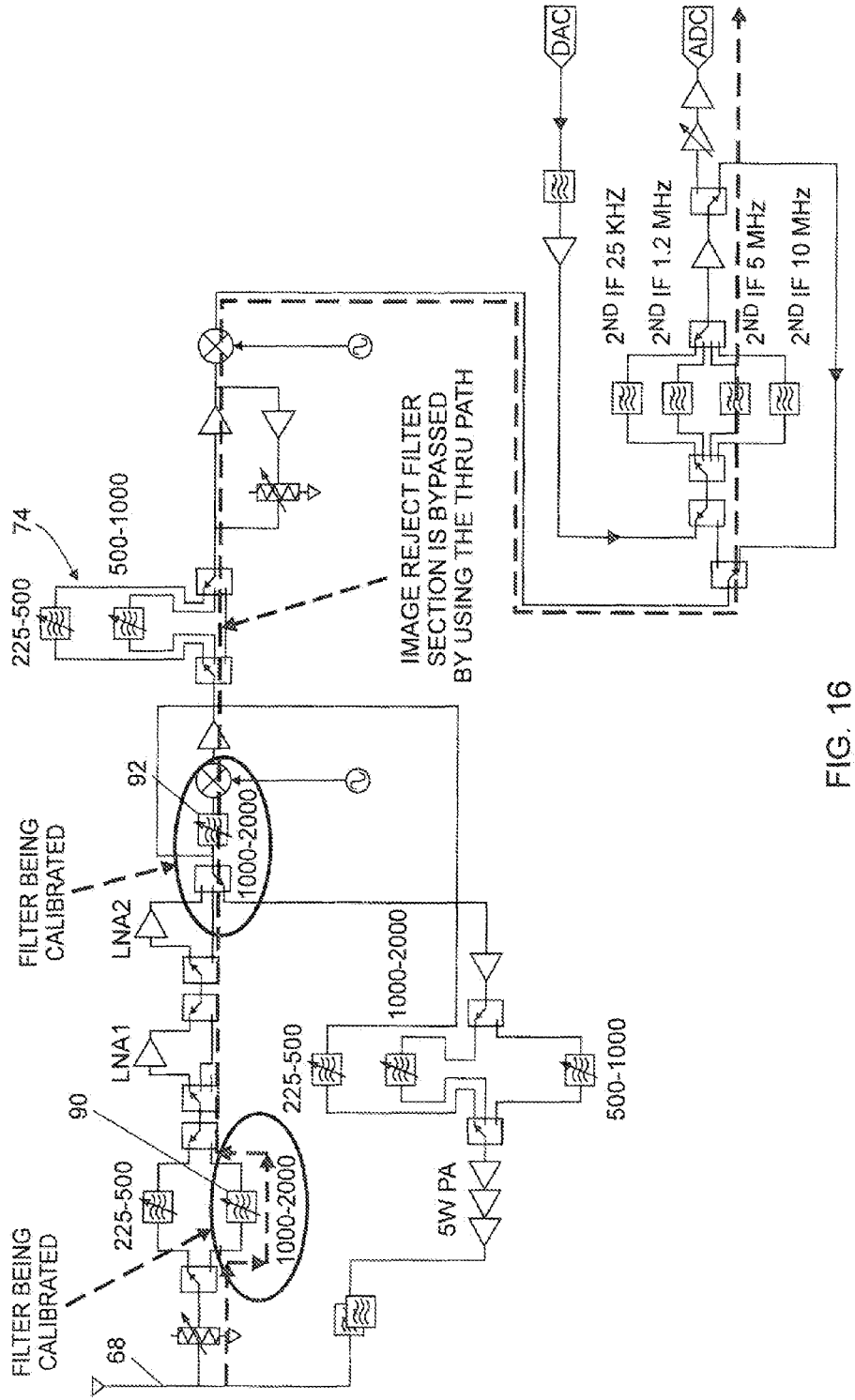

FIG. 16 illustrates a calibration procedure for a 1000-2000 MHz front end filter 90 and a 1000-2000 image reject filter 92, according to the invention. The CCA 10 is set to Rx mode, and the first mixer stage 72, image reject filter bank 74, and successive stages of the Rx chain are bypassed directly to the measurement instruments 18 as in FIG. 14. The filter 90 is tuned for maximum response to each of a number of test tones between 1000 and 2000 MHz at the antenna port 68, and the voltage (or DAC word count) that corresponds to the maximum response for each tone is stored to define a tuning curve for the filter 90.

Then image reject filter 92 is then calibrated for maximum response to each of the test tones between 1000 and 2000 MHz, with the FE filter 90 tuned to each tone according to its already defined tuning curve. As a result, tuning curves for both of the 1000-2000 MHz FE and image reject filters 90, 92 are obtained.

Figure 17:
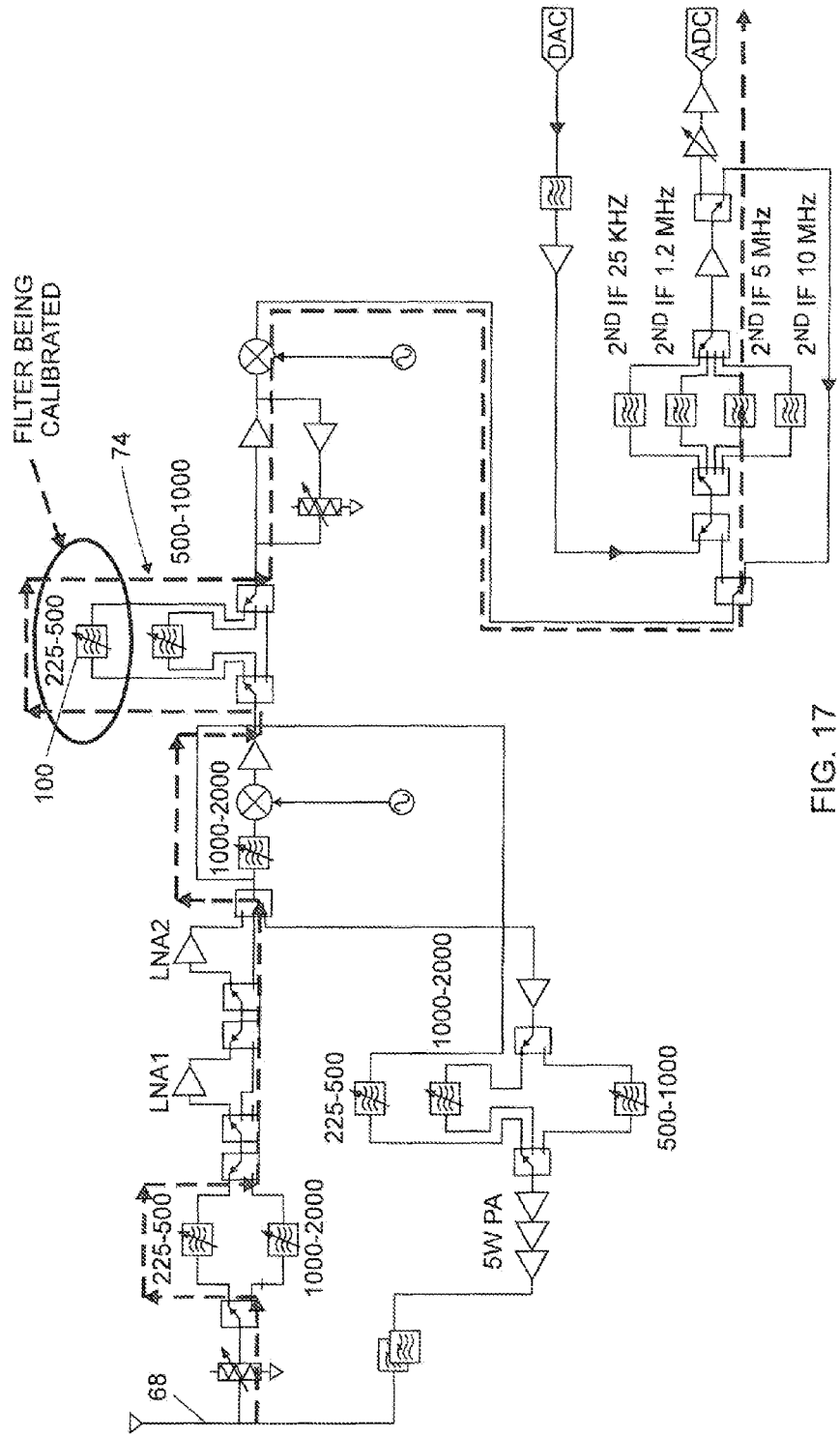

FIG. 17 illustrates a calibration procedure for a 225-500 MHz image reject filter 100 in the filter bank 74, according to the invention. The CCA 10 is set to Rx mode, the image reject filter 100 is switched in circuit, and the test tones between 225 and 500 MHz are applied to the antenna terminal 68. Because the 225-500 MHz FE filter 70 was already calibrated per FIG. 14, the filter 70 can be tuned to each of the test tones according to its known tuning curve. The image reject filter 100 is then tuned for maximum response to each of the test tones between 225 and 500 MHz, and the voltage (or DAC word count) that corresponds to the maximum response for each tone is stored to define a tuning curve for the filter 100.

Figure 18:
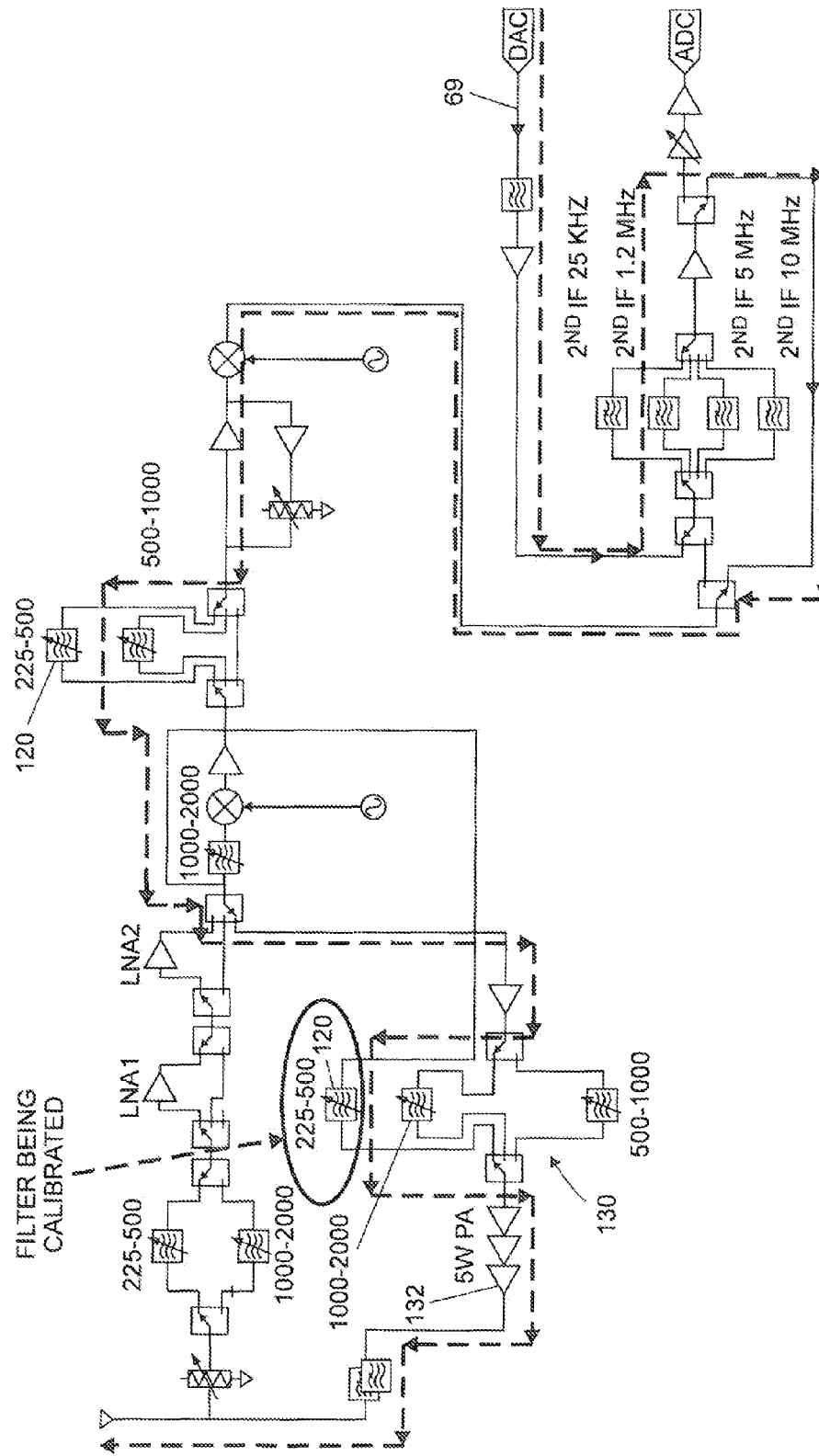

FIG. 18 shows a calibration procedure for another 225-500 MHz image reject filter 120 in a filter bank 130 arranged at the input of a power amplifier (PA) stage 132 in the transmit (Tx) chain of the CCA 10, according to the invention. The CCA 10 is set to Tx mode, the 225-500 MHz image reject filter 120 is switched in circuit to allow a Tx intermediate frequency signal within the filter range to pass, and a number of test frequency tones are directed from a signal generator of the instruments 18 to IF terminal 69 of the CCA. Because the tuning curve for the 225-500 MHz image reject filter 100 was already calibrated per FIG. 16, its tuning curve is known and the filter 100 can be tuned to pass each of the test tones to the filter 120. The image reject filter 120 is then tuned for maximum response to each of the tones between 225 and 500 MHz, and the voltage or word count that corresponds to the maximum response for each tone is stored to define a tuning curve for the filter 120.

Figure 19:
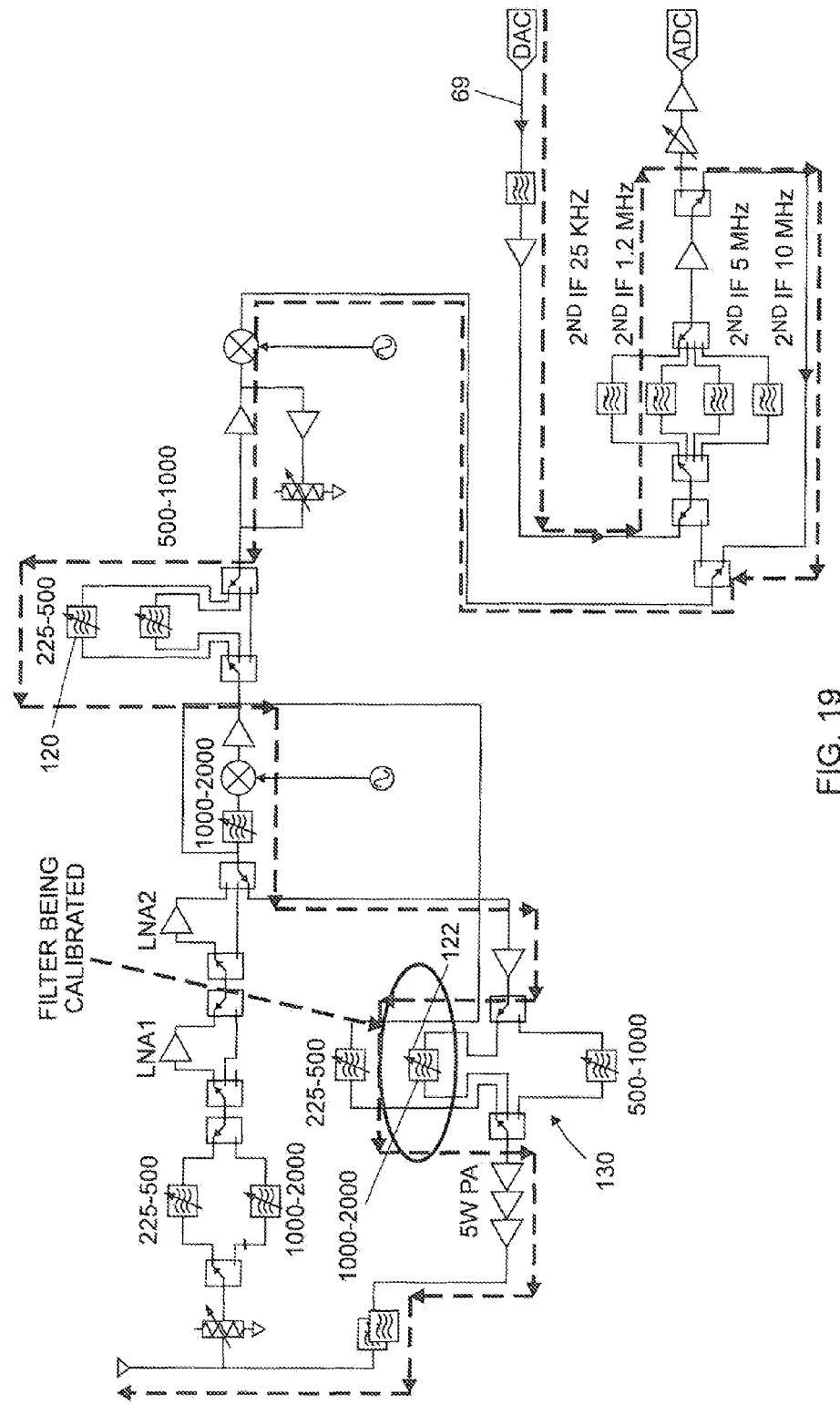

FIG. 19 shows a calibration procedure for a 1000-2000 MHz image reject filter 122 in the PA input filter bank 130. The CCA 10 is set to Tx mode, the 225-500 MHz image reject filter 120 is switched in circuit to allow a Tx intermediate frequency signal within the filter range to pass, and a number of test frequency tones are supplied from a signal generator of the instruments 18 to the IF terminal 69 of the CCA. Because the tuning curve for the 225-500 MHz image reject filter 100 was already calibrated per FIG. 16, its tuning curve is known and the filter 100 can be tuned to pass each of the test tones (after mixing) to the filter 122. The image reject filter 122 is then tuned for maximum response to each of the mixed tones ranging between 1000 and 2000 MHz, and the voltage or word count that corresponds to the maximum response for each tone is stored to define a tuning curve for the filter 122.

EXAMPLE THREE

Figure 20:
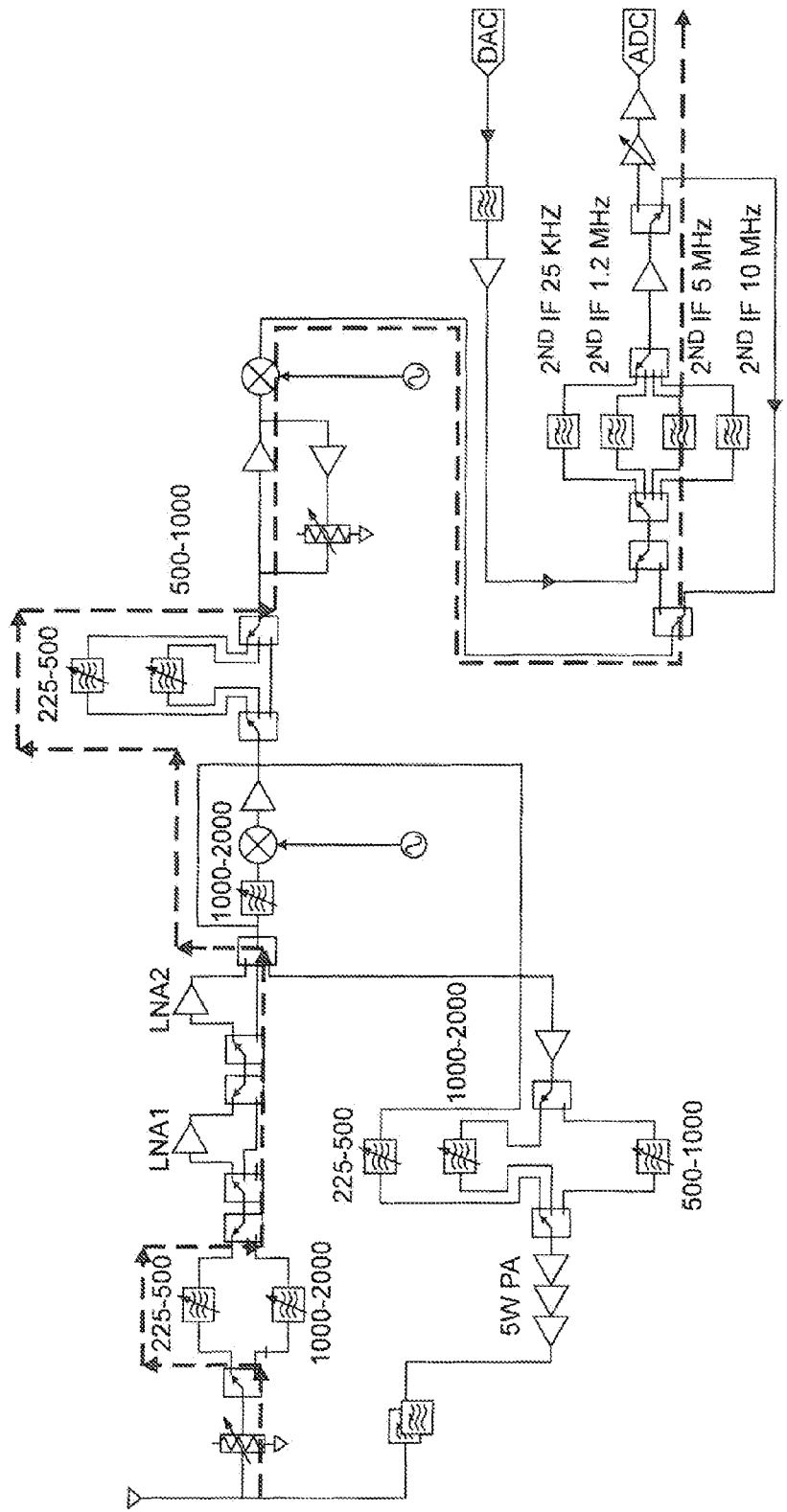
FIGS. 20 to 21 illustrate a calibration of a receive chain in the UUT.
Figure 21:
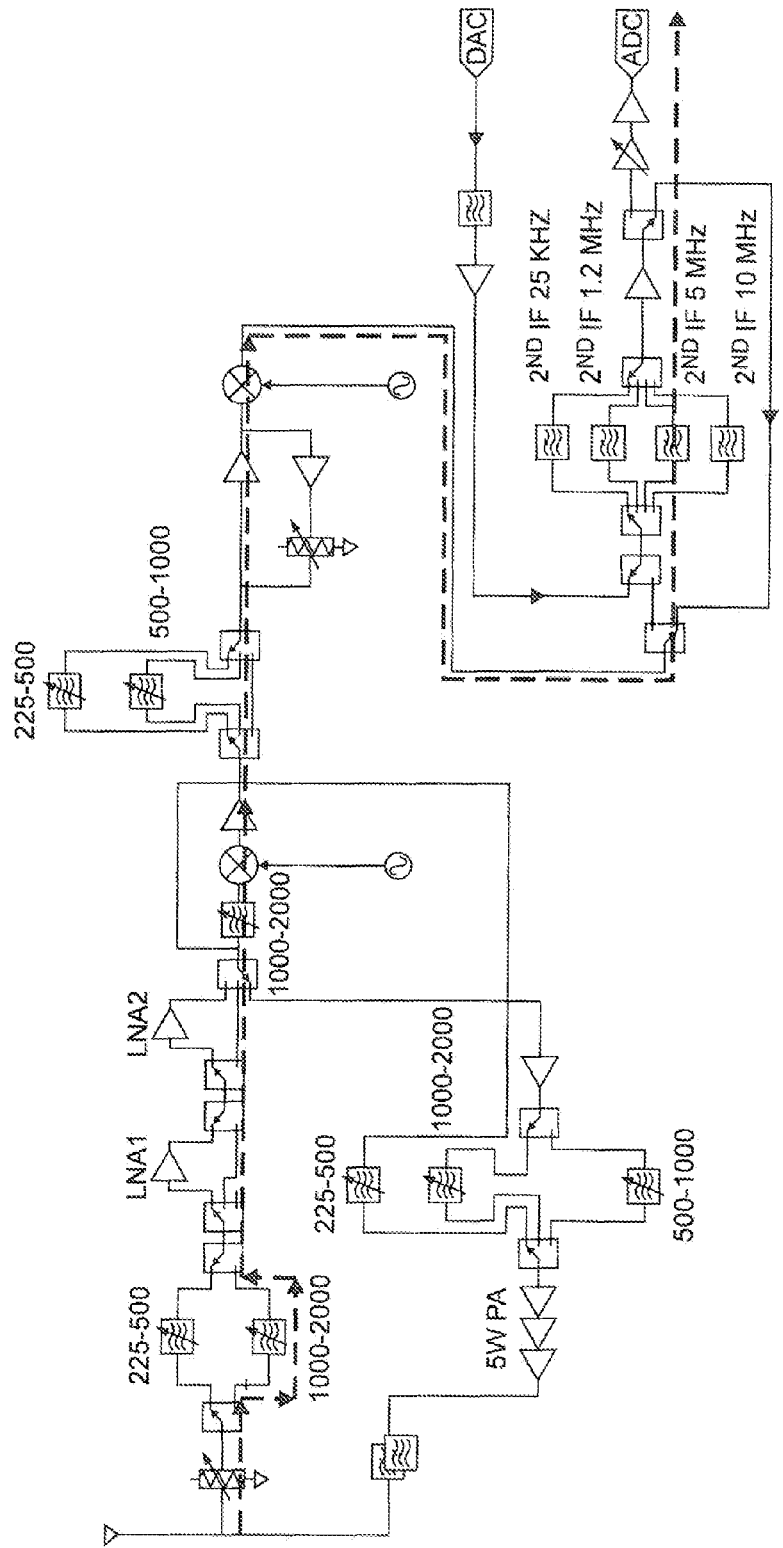

Receiver (Rx) Calibration (FIGS. 20-21)

FIG. 20 illustrates a Rx AGC calibration for the 225-500 MHz range for the CCA 10. It is assumed that calibration curves for all of the 225-500 MHz filters have been determined and stored as detailed above. A method of calibrating the automatic gain control (AGC) curve for the module is explained below.

The front end filter and image reject filters are engaged and tuned to each of a number of UHF test frequency tones applied to the RF terminal 68 with amplitudes ranging between, e.g., −100 dbm to +10 dbm. Gain, as measured by, e.g., a spectrum analyzer, versus power in (Pin) curves are generated for each of the frequencies, and are stored in the module FRAM.

FIG. 21 illustrates a Rx AGC calibration for the 1000-2000 MHz (L band) range for the CCA 10. It is assumed that calibration curves for all of the 1000-2000 MHz filters have been determined and stored as detailed above. A method of calibrating the automatic gain control (AGC) curve for the module is explained below.

The front end filter and image reject filters are engaged and tuned to each of a number of L band test frequency tones applied to the RF terminal 68 with amplitudes ranging between, e.g., −100 dbm to +10 dbm. Gain, as measured by, e.g., a spectrum analyzer, versus power in (Pin) curves are generated for each of the frequencies, and are stored in the module FRAM.

EXAMPLE FOUR

Figure 22:
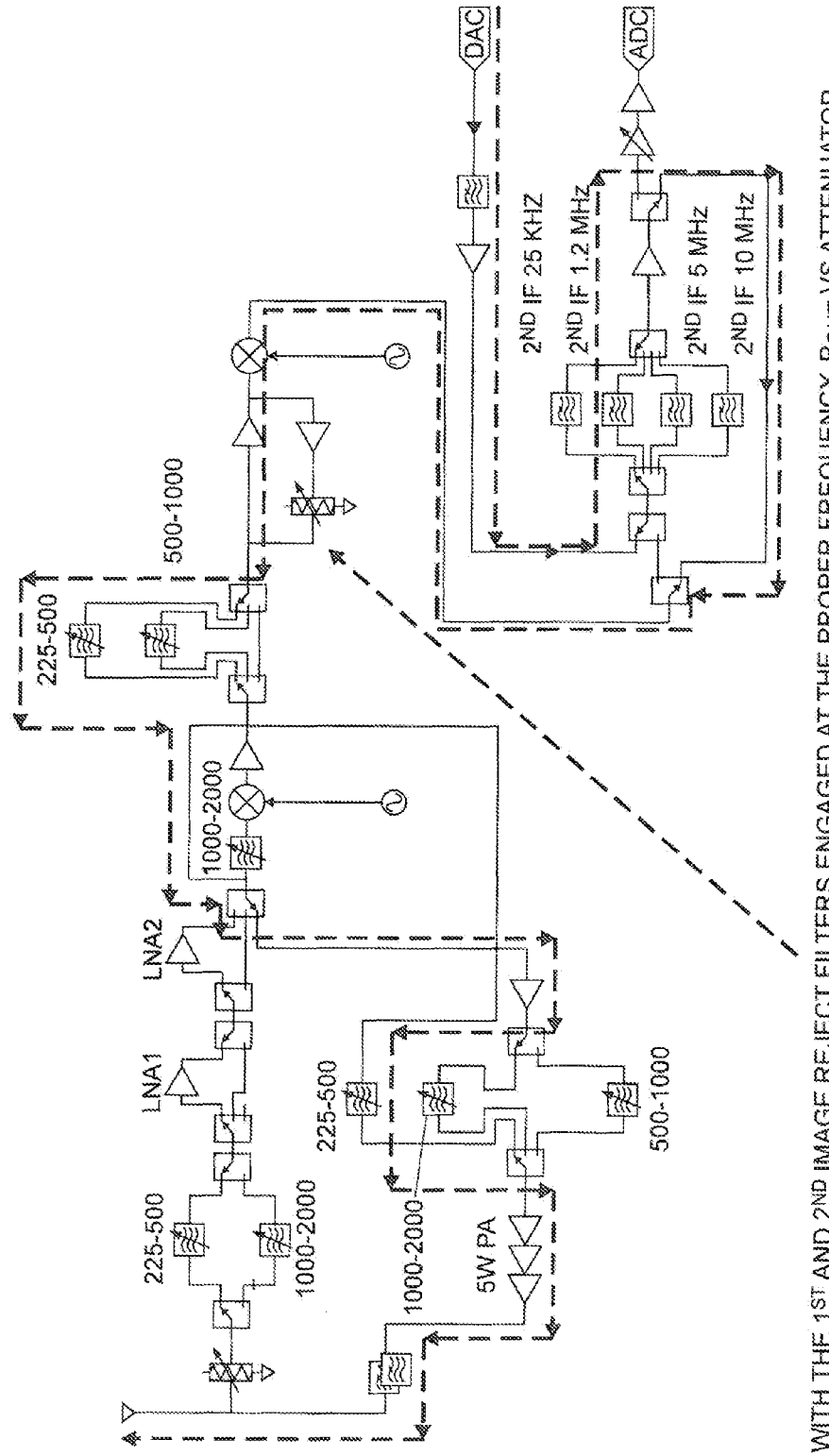
FIGS. 22 to 23 illustrate a calibration of a transmit chain in the UUT
Figure 23:
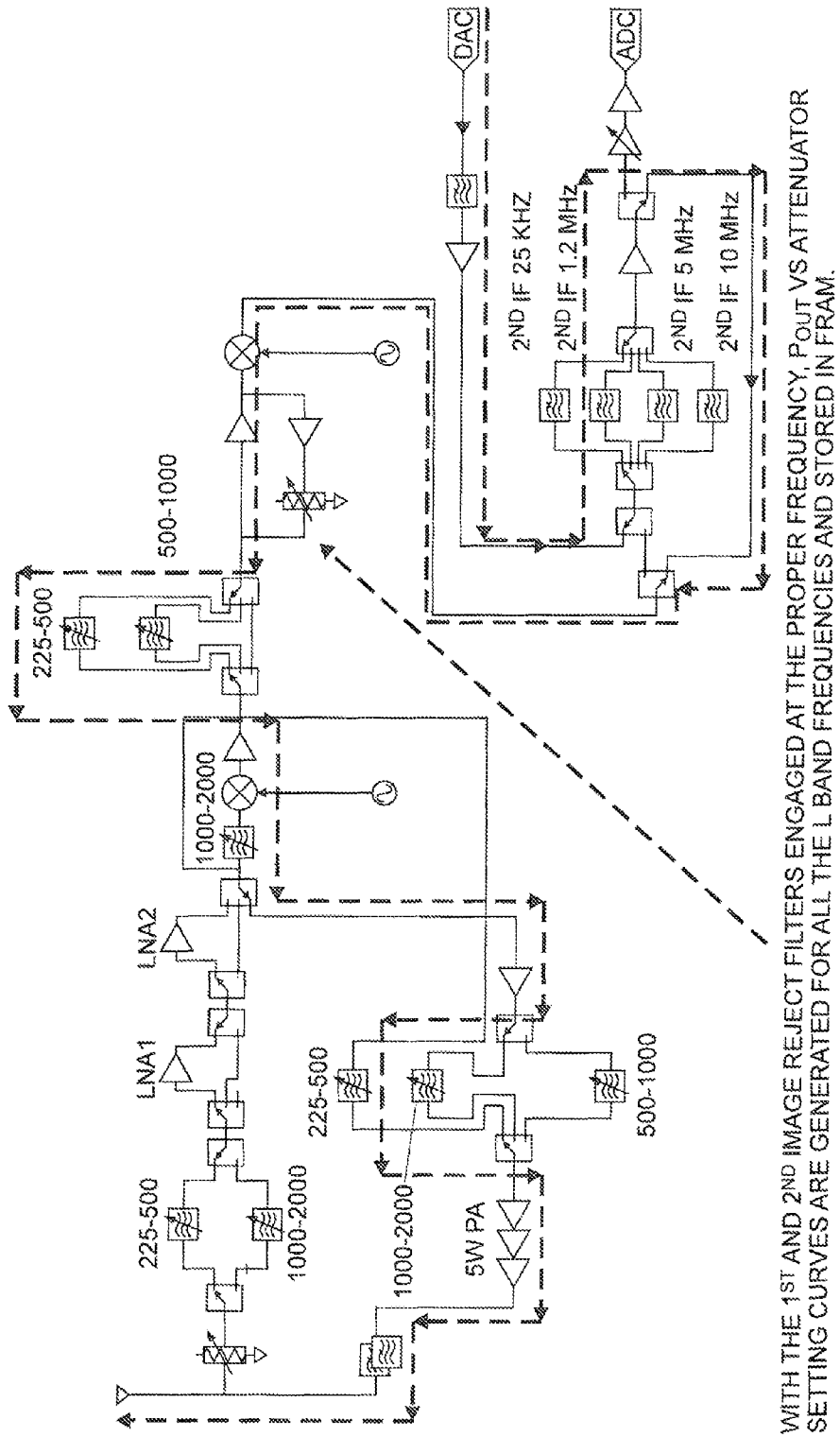

Transmit (Tx) Calibration (FIGS. 22-23)

FIG. 22 shows paths through the CCA 10 that are activated for a 225-500 MHz (UHF) transmit calibration. It is assumed that all the module filters have been calibrated so that their tuning curves are known.

The module is set to Tx mode, the 225-500 MHz image reject filters are engaged and tuned to the Tx operating frequency. Transmit power out (Pout) vs attenuator setting curves are generated for all the UHF frequencies and are stored in the associated FRAM.

FIG. 23 shows paths through the CCA 10 that are activated for a 1000-2000 MHz (L band) transmit calibration. It is assumed that all the module filters have been calibrated so that their tuning curves are known.

The module is set to Tx mode. With the 225-500 MHz image reject filters engaged and set at a fixed 2 d IF frequency, Pout vs attenuator setting curves are generated for all of the L band test frequencies and are stored in the FRAM.

Those skilled in the art will appreciate that in contrast to manual RF calibration techniques, the test program 14 and the adapter board 12 allow the CCA 10 to be activated, debugged, tested and calibrated, and for determined voltage settings to be stored in a memory on the CCA 10, all prior to mating the CCA 10 with other stages of the communications platform of which the CCA 10 is a part. The calibration can proceed unattended, with the CCA 10 being entirely digitally controlled while installed at the test station 8.

While the foregoing represents preferred embodiments of the invention, those skilled in the art will understand that various changes, modifications, and additions may be made without departing from the spirit and scope of the invention, and that the present invention includes all such changes and modifications as are within the scope of the following claims.

We claim:

1. A system for testing and calibrating a core engine radio frequency circuit card assembly, comprising:
    a processor programmed and configured to perform a test or calibration procedure on a given core engine radio frequency circuit card assembly (CCA) in response to commands entered by an operator;
    test and measurement instruments operatively connected to the processor and including a power supply for activating selected ones of a number of defined signal paths in the CCA for test or calibration, one or more signal generators for inputting test signals to each selected signal path, and one or more instruments for measuring corresponding output signals from each selected signal path in response to the test signals input to the path from the signal generators;
    wherein the CCA includes switches and terminals in each of the signal paths, and the switches and terminals are configured for receiving the test signals for each selected signal path in the CCA and for outputting the corresponding output signals from the selected signal path to the test and measurement instruments, while isolating the selected signal path from other signal paths to which the selected signal path is otherwise connected in the CCA;
    a test adapter operatively connected to the processor and arranged for connecting to the CCA, wherein the adapter is constructed and arranged for selectively operating the switches in the CCA and for connecting the terminals of the CCA to the test and measurement instruments under the control of the processor so that when performing a test or calibration procedure on each selected signal path in the CCA, (i) the signal path is isolated from the other signal paths in the CCA, (ii) the test signals are input to the selected signal path, and (iii) the corresponding output signals from the signal path are returned to the test and measurement instruments;
    the processor and the adapter are configured to interoperate with the CCA to form a feedback loop wherein the corresponding output signals from each selected signal path in response to the test signals are compared with preset threshold levels for certain operating parameters of the CCA, and, if the output signals are outside the threshold levels, the test signals are adjusted until the output signals are within the threshold levels; and
    the CCA has an associated memory for storing calibrated values or settings for a number of operating parameters of the CCA including one or more of (1) voltage settings for RF and IF voltage tuned filters in the CCA, (2) settings associated with an AGC receive signal strength indicator (RSSI) curve, (3) transmitter pre-amplifier and final amplifier bias voltages to control RF amplifier gain, (4) AGC settings to maintain a transmit output power level within a required range, and (5) phase-locked loop calibration of relative RF output phase with respect to a reference signal.

2. The system according to claim 1, wherein the memory associated with the CCA is a ferroelectric read only memory (FRAM) disposed on the CCA.

3. The system according to claim 1, wherein the processor and the adapter are configured to obtain and store in the associated memory calibrated tuning curves for a number of voltage tuned filters over selected receiving and transmitting paths in the CCA.

4. The system according to claim 1, wherein the processor and the adapter are configured to obtain and store in the associated memory a calibrated automatic gain control (AGC) curve over a selected receive (Rx) path in the CCA.

5. The system according to claim 1, wherein the processor and the adapter are configured to obtain and store in the associated memory a calibrated power out (Pout) versus attenuator curve over a selected transmit (Tx) path in the CCA.

6. The system according to claim 1, wherein the processor is configured to initiate a built in test sequence provided in the CCA.

7. The system according to claim 1, wherein the processor is programmed to have a graphical user interface (GUI).

8. The system according to claim 4, wherein the processor and the adapter are configured to obtain and store the AGC curve in the associated memory for multiple test frequencies over the selected Rx path in the CCA.

9. The system according to claim 5, wherein the processor and the adapter are configured to obtain and store the Pout versus attenuator curve in the associated memory for multiple test frequencies over the selected Tx path in the CCA.

10. The system according to claim 1, wherein the test and measurement instruments are constructed and arranged for operation at test frequencies between about 225 MHZ and about 2000 MHZ.

11. The system according to claim 10, wherein the processor and the adapter are constructed and arranged for testing and calibrating selected signal paths in the CCA over certain frequency ranges including, approximately, 225 MHZ to 500 MHZ, 500 MHZ to 1000 MHZ, and 1000 MHZ to 2000 MHZ.

12. The system according to claim 1, including a test station having a fixture cover panel, the fixture cover panel has a cutout, and the test station is constructed and arranged so that the CCA is mounted beneath the cutout when the CCA is tested and calibrated by the system.

* * * * *